United States Patent
Yamawaki et al.

[11] Patent Number: 6,118,172
[45] Date of Patent: *Sep. 12, 2000

[54] HIGH-FREQUENCY CIRCUIT DEVICE AND MANUFACTURING METHOD THEREOF

[75] Inventors: Masao Yamawaki; Tatsuhiko Ikeda; Noriharu Suematsu; Yoshihiro Kashiba, all of Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/602,667

[22] Filed: Feb. 16, 1996

[30] Foreign Application Priority Data

Sep. 4, 1995 [JP] Japan .................................. 7-226449

[51] Int. Cl.$^7$ ...................... H01L 27/082; H01L 27/102; H01C 29/73
[52] U.S. Cl. ............................................. 257/593; 257/566
[58] Field of Search .................... 257/275, 593, 257/566

[56] References Cited

U.S. PATENT DOCUMENTS

| | | | |
|---|---|---|---|
| 4,418,470 | 12/1983 | Naster et al. | 438/149 |
| 5,559,349 | 9/1996 | Cricchi et al. | 257/275 |

FOREIGN PATENT DOCUMENTS

| | | |
|---|---|---|
| 0 371 849 | 6/1990 | European Pat. Off. . |
| 1-302743 | 12/1989 | Japan . |
| 4-154147 | 5/1992 | Japan . |
| 5-36953 | 2/1993 | Japan . |
| 90-8645 | 6/1990 | Rep. of Korea . |

OTHER PUBLICATIONS

Arye Rosen et al., "Silicon as a Millimeter–Wave Monolithically Integrated Substrate–A New Look", RCA Review, vol. 42, Dec. 1981, pp. 633–661.

Maurice H. Hanes et al., "Microx™–An All–Silicon Technology for Monolithic Microwave Integrated Circuits", The Electron Device Letters, vol. 14, No. 5, May 1993, pp. 219–221.

"Propagation of picosecond electrical pulses on a silicon–based microstrip line with buried cobalt silicide ground plane,", Appl. Phys. Lett., vol. 58, No. 23, Jun. 10, 1991, 1991 American Institute of Physics, pp. 2604–2606.

*Primary Examiner*—John Guay
*Attorney, Agent, or Firm*—McDermott, Will & Emery

[57] ABSTRACT

An epitaxial layer is formed on a main surface of a high specific resistance silicon substrate having a specific resistance of at least 100 Ωcm. A circuit element such as an active element is formed in epitaxial layer. An oxide film is formed such that it covers a surface of epitaxial layer. A metal interconnection layer is formed on a surface of oxide film. An oxide film is formed such that it covers metal interconnection layer. Thus, an inexpensive HF circuit device capable of reducing transmission loss of HF signals can be obtained.

3 Claims, 18 Drawing Sheets

HIGH-FREQUENCY CIRCUIT DEVICE AND MANUFACTURING METHOD THEREOF

BACKGROUND OF THE INVENTION

1. Field of the Invention

The present invention relates to a high-frequency (HF) circuit device and a manufacturing method thereof. Particularly it relates to an HF circuit device having a good HF characteristic and having a substrate structure in which transmission loss of an HF signal is small and a manufacturing method thereof.

2. Description of the Background Art

In recent years, the use of an HF circuit device using GHz band for a movable telephone has spread. With the spread of the use of the HF circuit device, there is a greater need for lowering the cost of the HF circuit device. In order to satisfy the need, it is desired that the cost of an integrated circuit device for processing signals used in the HF circuit be lowered.

In a convectional signal processing circuit accommodating a signal of GHz band, an expensive semiconductor device using, for example, GaAs has been used. However, for higher integration and lower cost of the circuit, shifting to a silicon device is desired. As a recent silicon device is further miniaturized and has its HF characteristic improved, a similar performance to that of the conventional GaAs device is being implemented in a circuit arrangement using a bipolar device or a CMOS circuit.

However, while the performance of the silicon device has been improved as described above, signal loss through a silicon substrate is a problem in terms of integrated circuit structure, since the silicon substrate is conductive to HF signals. For the GaAs device described above, since an active element is formed on a GaAs substrate as an insulator, dielectric loss in the substrate is small. Accordingly, an integrated circuit having a superior HF characteristic will be obtained.

Now, referring to FIG. 32, an example of an HF circuit device using a conventional, general silicon substrate will be described. FIG. 32 is a schematic cross sectional view of an example of a conventional HF circuit device using a silicon substrate.

Referring to FIG. 32, an oxide film 3 is formed on a silicon substrate 11c having a specific resistance of approximately several 10 Ωcm. A metal interconnection layer 4 is formed on oxide film 3. An oxide film 5 is formed such that it covers metal interconnection layer 4. On a back surface of silicon substrate 11c, a back-surface metal interconnection layer 6 is formed, since solder is used at the time of assembling.

By applying an HF signal to the interconnection of the HF circuit device using the conventional silicon substrate as described above, a line of electric force will extend into silicon substrate 11c. Accordingly, as shown in FIG. 32, loss of resistance component Ri and loss Rm between metal interconnection layers 4 in silicon substrate 11c are equivalently added, and signal loss and resistive coupling components between the interconnections will appear. Such a loss results from the fact that silicon substrate 11c is a dielectric having loss.

Generally, dielectric loss tangent tan δ is used to express the amount of loss described above. The dielectric loss tangent tanδ is defined by complex dielectric constant (real number part/imaginary part). The real number part for the numerator corresponds to the resistance loss. Therefore, if as the value of tan δ is larger, the resistance loss increases. For silicon substrate 11c generally known as having a specific resistance of several ten Ω, the value of tan δ is approximately two to three. On the other hand, for a GaAs substrate, tan δ is as small as approximately 0.001. For this reason, there has been a problem that transmission loss of HF signals becomes greater when silicon substrate 11c, which has been conventionally used in general, is used simply in place of the GaAs substrate.

SUMMARY OF THE INVENTION

The present invention is used to solve the problems described above. The object of the invention is to provide an HF circuit device having a substrate structure in which transmission loss of HF signals is small and a method of manufacturing the same with low cost.

According to one aspect of the present invention, the HF circuit device is provided with a silicon substrate having a main surface and having a specific resistance of at least 100 Ωcm, an insulating layer and a metal interconnection layer. The insulating layer is formed such that it covers the main surface of the silicon substrate. The metal interconnection layer is formed on the insulating layer.

As described above, in one aspect of the HF circuit device according to the present invention, the specific resistance of the silicon substrate is at least 100 Ωcm. This value is fairly greater than the specific resistance of a conventional silicon substrate generally known (approximately several ten Ωcm). Transmission loss of HF signals in a silicon substrate is proportional to a specific resistance of a silicon substrate. Therefore, by increasing the specific resistance of the silicon substrate, the transmission loss of HF signals can be reduced. To be more specific, assuming the specific resistance of the conventional silicon substrate generally known is 10 Ωcm, the transmission loss of HF signals will be reduced to approximately ⅒ by using a silicon substrate having a specific resistance of 100 Ωcm in place of the conventional silicon substrate. Therefore, an HF circuit device having an improved HF characteristic can be obtained. This tendency is notable when the specific resistance of the silicon substrate is further increased. Furthermore, cost will further be reduced by using the silicon substrate in place of a GaAs substrate.

In another aspect of the HF circuit device according to the present invention, a silicon substrate having a main surface, a silicon layer, an insulating layer and a metal interconnection layer are provided. The silicon layer is formed on the main surface of the silicon substrate with a shield metal layer interposed. The insulating layer is formed such that it covers the silicon layer. The metal interconnection layer is formed on the insulating layer.

As described above, in another aspect of the present invention, the HF circuit device is provided with a shield metal layer. In the HF circuit device according to the present aspect, a circuit element such as an active element is formed in the silicon layer. At that time, as the shield metal layer is provided between the silicon layer and the silicon substrate, a line of electric force from the active element described above is shielded by the shield metal layer and does not reach the silicon substrate. Therefore, even when an ordinary silicon substrate is used, an HF circuit device in which transmission loss of HF signals is reduced can be obtained. Furthermore, by reducing the thickness of the silicon layer, transmission loss of HF signals can further be reduced.

In still another aspect of the HF circuit device according to the present invention, a substrate having a main surface and consisting of insulator, a silicon layer, an insulating layer and a metal interconnection layer are provided. The silicon layer is formed on the main surface of the substrate. The insulating layer is formed such that it covers the silicon layer. The metal interconnection layer is formed on the insulating layer.

As described above, in the still another aspect, the HF circuit device is provided with a substrate consisting of insulator. An example of the insulator is quartz. Thus, by using the substrate consisting of insulator, transmission loss of HF signals in the substrate can be greatly reduced. Furthermore, also in this case, an appropriate choice of substrate material can further reduce the cost when compared with the use of the GaAs substrate.

In one aspect of a method of manufacturing the HF circuit device of the present invention, first and second insulating layers are firstly formed on main and back surfaces of a first silicon substrate having a specific resistance of at least 100 Ωcm, respectively. Then, the first insulating layer formed on the main surface of the first silicon substrate and a second silicon substrate are joined together. Then, the thickness of the second silicon substrate is reduced to form a silicon layer on the first insulating layer. After the second insulating layer formed on the back surface of the first silicon substrate is removed, a circuit element is formed on a main surface of the silicon layer. An insulating layer is formed such that it covers the silicon layer. A metal interconnection layer is formed on the insulating layer.

As described above, in the above-mentioned one aspect of the method for manufacturing the HF circuit device according to the present invention, a second silicon substrate is joined to a main surface of a first silicon substrate having a specific resistance of at least 100 Ωcm with a first insulating layer interposed and the thickness of the second silicon substrate is reduced to form a silicon layer. This allows formation of a thin silicon layer. A circuit element is formed on a main surface of the silicon layer the thickness of which has been reduced. As the thickness of the silicon layer is thus reduced, transmission loss of HF signals will be reduced. Furthermore, as the first silicon substrate has a high specific resistance of at least 100 Ωcm, transmission loss of HF signals can be effectively reduced. In other words, an HF circuit device capable of reducing transmission loss of HF signals can be obtained.

In another aspect of the method for manufacturing the HF circuit device according to the invention, firstly a mask layer is selectively formed on a main surface of a silicon substrate having a specific resistance of at least 100 Ωcm. An impurity of a first conductivity type is selectively introduced by using the mask layer as a mask and diffused in a main surface of the silicon substrate, thereby selectively forming a buffer silicon layer at the main surface of the silicon substrate. By heat treatment to the buffer silicon layer, it is expanded along a main surface of the silicon substrate. The mask layer described above is again used as a mask and an impurity of a second conductivity type is introduced to a surface of the buffer silicon layer. After the mask layer is removed, a buried collector layer is formed by forming an epitaxial layer at a main surface of the silicon substrate. A circuit element is formed on a surface of the epitaxial layer. An insulating layer is formed such that it covers the epitaxial layer, and a metal interconnection layer is formed on the insulating layer.

As described above, in the above-mentioned another aspect of the method for manufacturing the HF circuit device according to the present invention, a mask layer is used as a mask, an impurity of a first conductivity type is selectively introduced to and diffused in a main surface of a silicon substrate to form a buffer silicon layer, and heat treatment is performed on the buffer silicon layer to expand the buffer silicon layer along a main surface of the silicon substrate. Then, after an impurity of a second conductivity type is introduced to a surface of the buffer silicon layer using the mask layer described above as a mask, an epitaxial layer is formed on a main surface of the silicon substrate. This ensures that a buried collector layer can be formed within the buffer silicon layer at the same time as the epitaxial layer is formed. This can simplify the manufacturing process when compared with the case where the buffer silicon layer is formed by the epitaxial growth method. Also, since it is ensured that the buried collector layer can be formed within the buffer silicon layer which, it ensured that widening of a depletion layer from the buried collector layer into the silicon substrate can be restrained, effectively restraining degradation in withstand voltage between the buried collector layers. Furthermore, as a silicon substrate having a high specific resistance of at least 100 Ωcm is used as the silicon layer, transmission loss of HF signals is effectively reduced.

In the still another aspect of the method for manufacturing the HF circuit device according to the present invention, a first buffer metal layer is firstly formed on a main surface of a first silicon substrate. A first shield metal layer is formed on the first buffer metal layer. A second buffer metal layer is formed on a main surface of a second silicon substrate. A second shield metal layer is formed on the second buffer metal layer. The first and second silicon substrates are joined by integrating the first and second shield metal layers. Then, a circuit element is formed at the second silicon substrate. An insulating layer is formed such that it covers the surface of the second silicon substrate. A metal interconnection layer is formed on the insulating layer.

As described above, in the still another aspect of the method of manufacturing the HF circuit device according to the present invention, first and second silicon substrates are joined together by integrating first and second shield metal layers formed on main surfaces of the first and second silicon substrates, respectively. This allows a shield metal layer to be formed between the first and second silicon substrates. Furthermore, a circuit element is formed at the second silicon substrate. By decreasing the thickness of the second silicon substrate, transmission loss of HF signals through the second silicon substrate can be reduced. Furthermore, as a shield metal layer is formed under the second silicon substrate, a line of electric force from the active element portion within the circuit element formed at the second silicon substrate is effectively shielded by the shield metal layer. This almost eliminates transmission loss of HF signals by the first silicon substrate. As a result, an HF circuit device in which transmission loss of HF signals is reduced can be obtained.

In still another aspect of the method for manufacturing the HF circuit device according to the present invention, an insulating layer is formed such that it covers a main surface of a first silicon substrate with a circuit element formed thereon. A metal interconnection layer is formed on the insulating layer. Then, by reducing the thickness of the silicon substrate at its back surface, a silicon layer is formed on the main surface of which the circuit element described above is formed. A first buffer metal layer is formed on a back surface of the silicon layer. A first shield metal layer is formed on the first buffer metal layer. A second buffer metal layer is formed on a main surface of a second substrate. A second shield metal layer is formed on the second buffer metal layer. Then, the second silicon substrate and the silicon layer are joined together by integrating the first and second shield metal layers.

As described above, in still another aspect of the method for manufacturing the HF circuit device according to the present invention, a silicon layer is formed by decreasing the thickness of a first silicon substrate after a circuit element is formed on a main surface of the first silicon substrate. In this case, since the silicon layer is not in the final shape, the thickness can greatly be reduced. This effectively reduces transmission loss of HF signals. Furthermore, as a shield metal layer is formed between the silicon layer and second silicon substrate described above, a line of electric force from the circuit element formed on a surface of the silicon layer is shielded by the shield metal layer. Therefore, it is considered that there is hardly transmission loss of HF signals by the second silicon substrate. Thus, an HF circuit device in which transmission loss of HF signals is effectively reduced will be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to FIGS. 1–31.

[First Embodiment]

Figure 1:
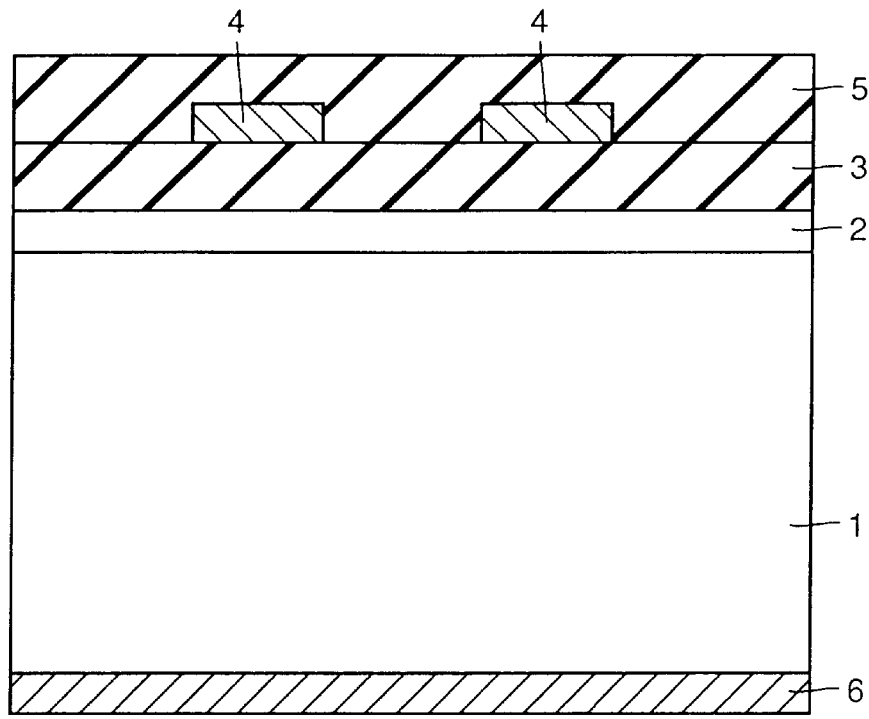
FIG. 1 is a cross sectional view of a first embodiment of the HF circuit device according to the present invention.

Firstly, referring to FIG. 1, a first embodiment of the HF circuit device of the present invention will be described. FIG. 1 a cross sectional view of the first embodiment of the HF circuit device of the present invention.

Referring to FIG. 1, an epitaxial layer 2 is formed on a main surface of a silicon substrate (referred to as "high specific resistance silicon substrate" hereinafter)1 having a specific resistance of at least 100 Ωcm. An oxide film 3 is formed on epitaxial layer 2. A metal interconnection layer 4 is formed on oxide film 3, and an oxide film 5 is formed such that it covers metal interconnection layer 4. A back-surface metal layer 6 of e.g. a gold alloy layer is formed on a back surface of high specific resistance silicon substrate 1, since solder is used at the time of assembling.

As described above, it is preferred that high specific resistance silicon substrate 1 has a specific resistance of at least 100 Ωcm. More preferably, the specific resistance of high specific resistance silicon substrate 1 is approximately 500–1000 Ωcm. Since transmission loss of HF signals is proportional to specific resistance, assuming that the specific resistance of a silicon substrate which has been conventionally used in general is 10 Ωcm, the use of high specific resistance silicon substrate 1 having a specific resistance of 1000 Ωcm can reduce transmission loss of HF signals to approximately 1/100. Thus, an HF circuit device in which transmission loss of HF signals is reduced can be obtained by using high specific resistance silicon substrate 1. Furthermore, the use of the silicon substrate can further reduce the cost when compared with the case where a GaAs substrate is used.

Epitaxial layer 2 is provided for forming a circuit element such as an active element therein, since it is impossible to form the active element such as a bipolar transistor and a CMOS circuit directly at a main surface of high specific resistance silicon substrate 1 due to constraints such as the setting of impurity concentration. Preferably, the thickness of epitaxial layer 2 is approximately 1–5 μm. Thus, by making the thickness of epitaxial layer 2 thin, a small transmission loss of HF signals can be maintained.

Methods for manufacturing high specific resistance silicon substrate 1 include, for example, CZ (CZochralski) method, FZ (Floating Zone) method and MCZ (Magnet CZochralski) method.

[Second Embodiment]

Figure 2:
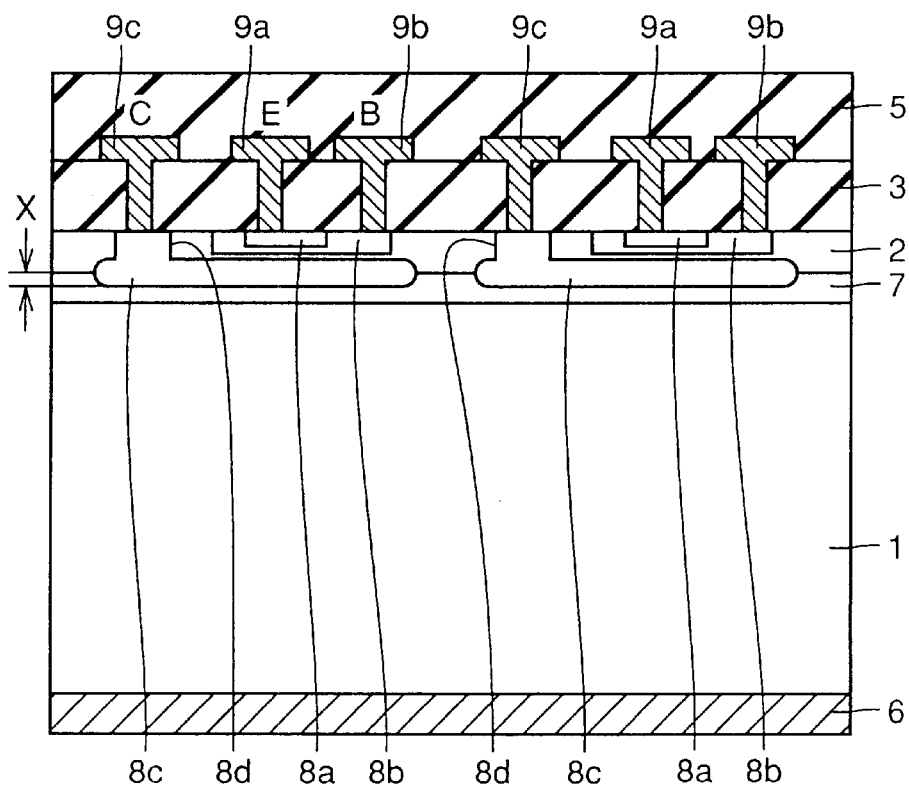
FIG. 2 is a cross sectional view of a second embodiment of the HF circuit device according to the present invention.

Referring now to FIG. 2, a second embodiment of the present invention will be described. FIG. 2 is a cross sectional view of the second embodiment of the HF circuit device of the present invention. In this embodiment, an HF circuit device is shown in which a bipolar transistor is formed as the active element.

Referring to FIG. 2, a buffer silicon layer 7 is formed on a main surface of a high specific resistance silicon substrate 1. An epitaxial layer 2 is formed on buffer silicon layer 7. A buried collector region 8c is formed between buffer silicon layer 7 and epitaxial layer 2. At a surface of epitaxial layer 2, a collector region 8d formed continuous to buried collector region 8c, a base region 8b and an emitter region 8a are formed.

An oxide film 3 is formed such that it covers a surface of epitaxial layer 2. Contact holes reaching surfaces of collector region 8d, base region 8b and emitter region 8a are formed at oxide film 3, and an emitter electrode 9a, a base electrode 9b and a collector electrode 9c are formed inside of the contact holes and on oxide film 3. An oxide film 5 is formed such that it covers emitter electrode 9a, base electrode 9b and collector electrode 9c. On a back surface of high specific resistance silicon substrate 1, a back-surface metal layer 6 is formed to allow for use of solder at time of assembling. Preferably, back-surface metal layer 6 is of gold alloy or the like.

Normally, when a bipolar transistor is formed, buried collector region 8c is formed, for example, by ion plantation before forming epitaxial layer 2. However, if high specific resistance silicon substrate 1 is used as is in the second embodiment, a depletion layer easily widens from a junction of buried collector region 8c and high specific resistance silicon substrate 1 into high specific resistance silicon substrate 1. This can lower the withstand voltage between adjacent buried collector regions 8c.

In order to restrain such a widening of the depletion layer, buffer silicon layer 7 is formed such that it surrounds the side and bottom portions of buried collector region 8c. The specific resistance of buffer silicon layer 7 may be the same as or lower than that of epitaxial layer 2. By the provision of the buffer silicon layer 7 described above, the widening of the depletion layer is effectively restrained and parasitic resistance of the device can be reduced.

Preferably, the thickness of buffer silicon layer 7 is approximately 4–5 $\mu$m. By making buffer silicon layer 7 thin as described above, transmission loss of HF signals can also be reduced. A method for forming buffer silicon layer 7 includes a forming method using ion implantation and diffusion, and epitaxial growth method, for example. The diffusion depth X of buried collector region 8c is approximately a few $\mu$m (1–2 $\mu$m).

[Third Embodiment]

Figure 3:
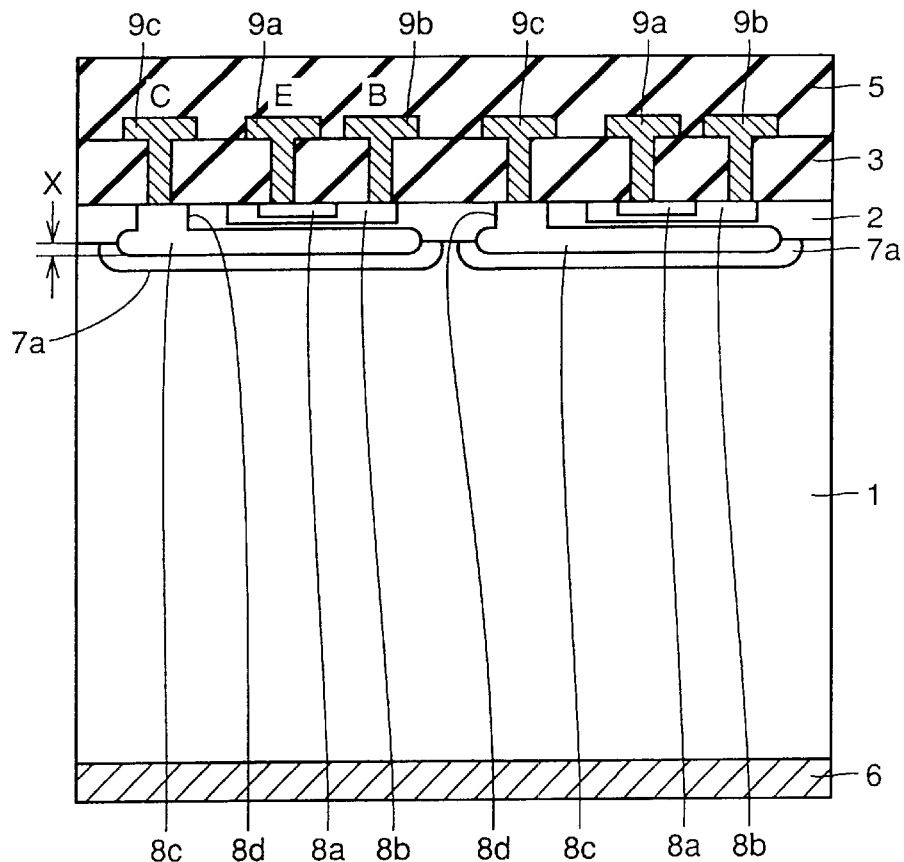
FIG. 3 is a cross sectional view of a third embodiment of the HF circuit device according to the present invention.

Referring now to FIGS. 3–10, a third embodiment of the present invention will be described. FIG. 3 is a cross sectional view of the third embodiment of the HF circuit device of the present invention.

Referring to FIG. 3, in the third embodiment, a buffer silicon layer 7a is selectively formed at a main surface of a high specific resistance silicon substrate 1. More specifically, buffer silicon layer 7a is selectively formed in the vicinity of side and bottom portions of a buried collector region 8c. Other than that structure, the present embodiment is similar to the second embodiment shown in FIG. 2. By selectively forming buffer silicon layer 7a as described above, a buffer silicon layer 7a forming region can be reduced. This can further reduce transmission loss of HF signals when compared with the second embodiment.

Referring now to FIGS. 4–10, a method for forming buffer silicon layer 7a will be described. FIGS. 4–10 are cross sectional views illustrating the first to seventh steps of a process for forming buffer silicon layer 7a shown in FIG. 3.

Figure 4:
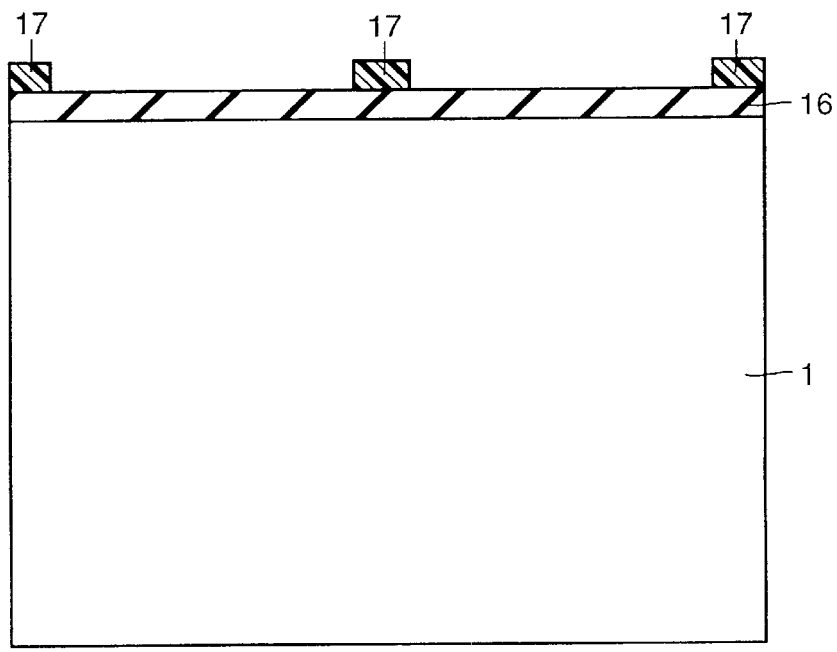
FIGS. 4–10 are cross sectional views illustrating the first to seventh steps of a process for forming the buffer silicon layer in the HF circuit device shown in FIG. 3, respectively.
Figure 5:
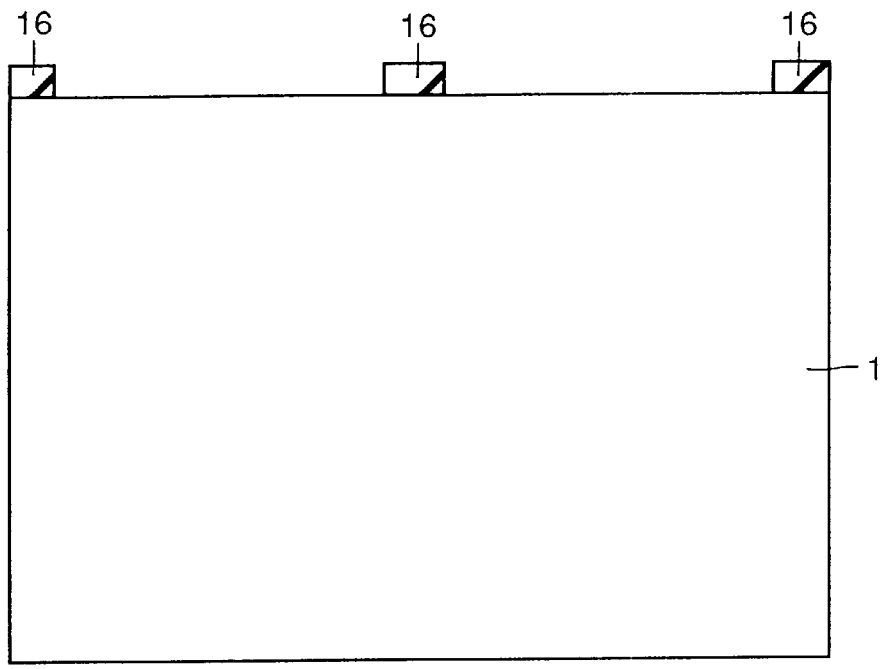

Referring firstly to FIG. 4, an oxide film 16 is formed on a main surface of a high specific resistance silicon substrate 1 and a photoresist 17 is applied onto oxide film 16. Then, by using photolithography, photoresist 17 is patterned so that that surface of oxide film 16 which is positioned on a forming region of buried collector region 8c is exposed.

Then, photoresist 17 is used as a mask and silicon oxide film 16 is etched. This selectively exposes a main surface of high specific resistance silicon substrate 1. Then, photoresist 17 is removed.

Figure 6:
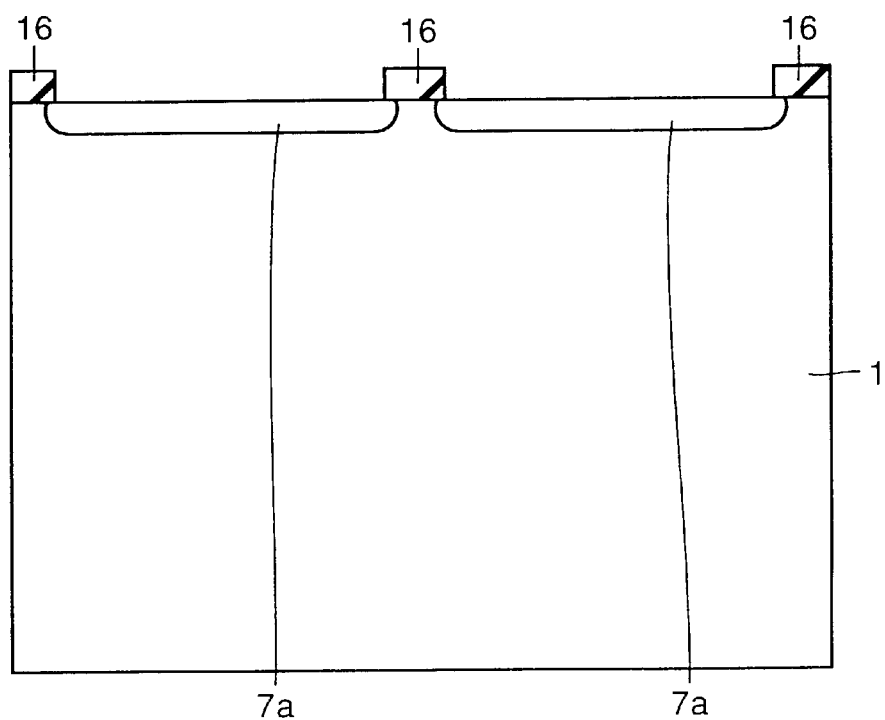

Referring now to FIG. 6, oxide film 16 is used as a mask and a predetermined impurity is implanted to a main surface of high specific resistance silicon substrate 1. For example, if an npn bipolar transistor is formed in an epitaxial layer 2, a p-type impurity such as boron (B) is implanted. Buffer silicon layer 7a is thus formed.

Figure 7:
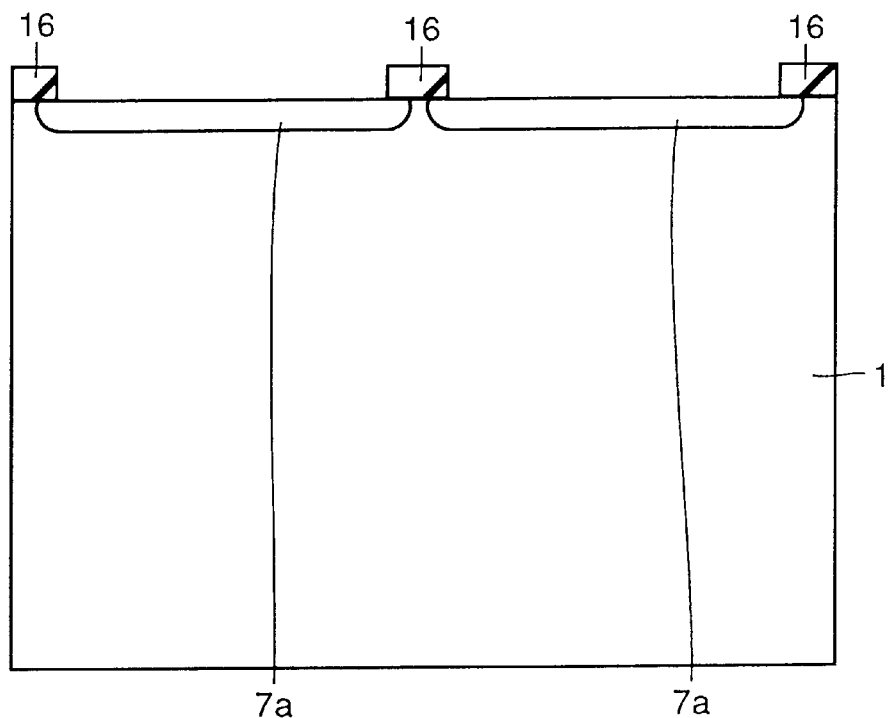
Figure 8:
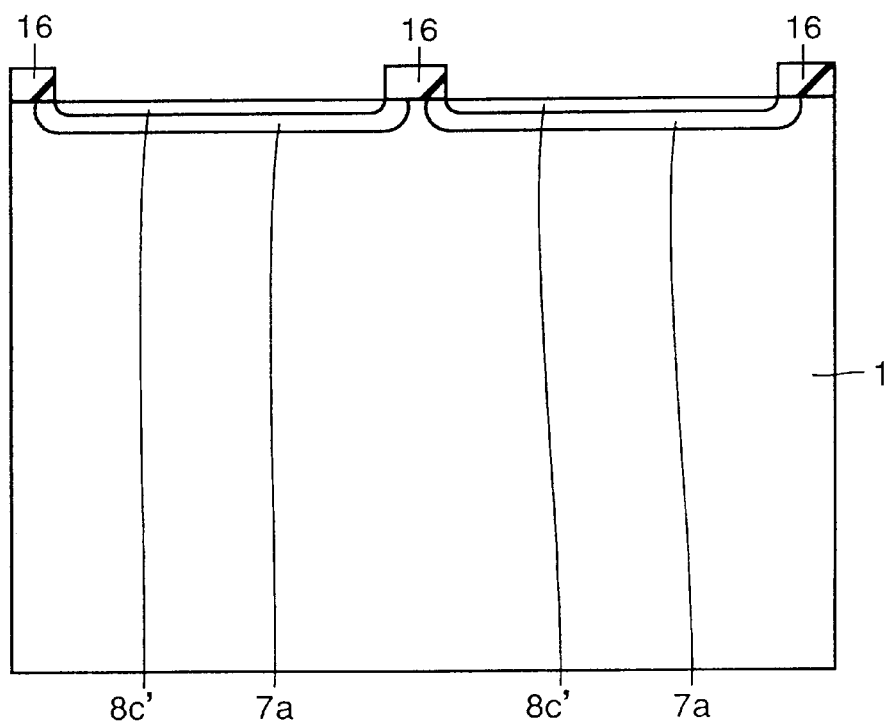

Then, heat treatment is performed on buffer silicon layer 7a shown in FIG. 6. This expands buffer silicon layer 7a along a main surface of high specific resistance silicon substrate 1, as shown in FIG. 7. As a result, the overlapping amount of oxide film 16 and buffer silicon layer 7a will increase.

Then, after the heat treatment to buffer silicon layer 7a as described above, referring to FIG. 8, oxide film 16 is again used as a mask and a predetermined impurity is implanted to a surface of buffer silicon layer 7a. This forms an impurity region 8c'. The impurity introduced into impurity region 8c' is an impurity for forming a buried collector region 8c, and if an npn bipolar transistor is formed, an n-type impurity such as antimony is selected. Oxide film 16 is then removed. That state is shown in FIG. 9.

Figure 9:
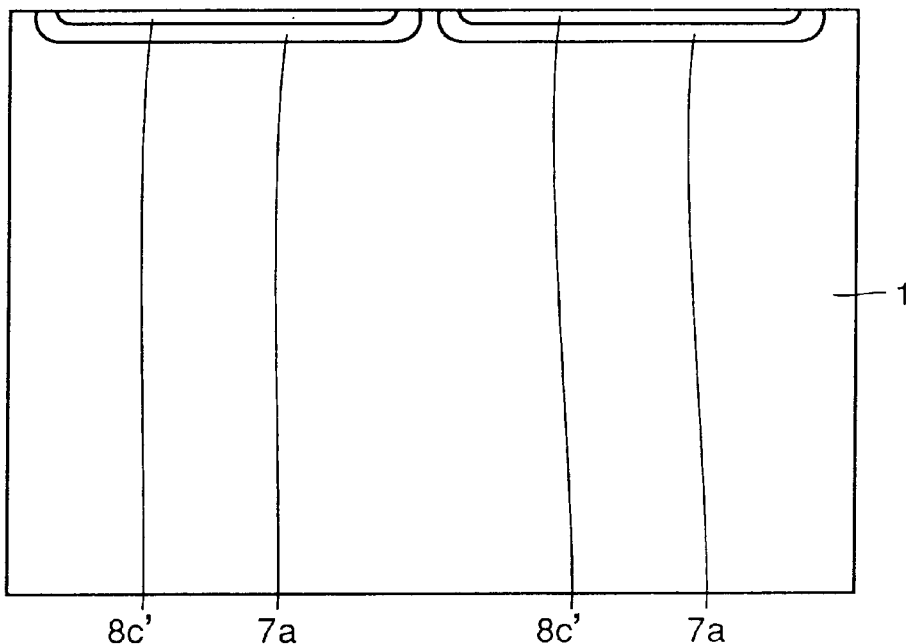
Figure 10:
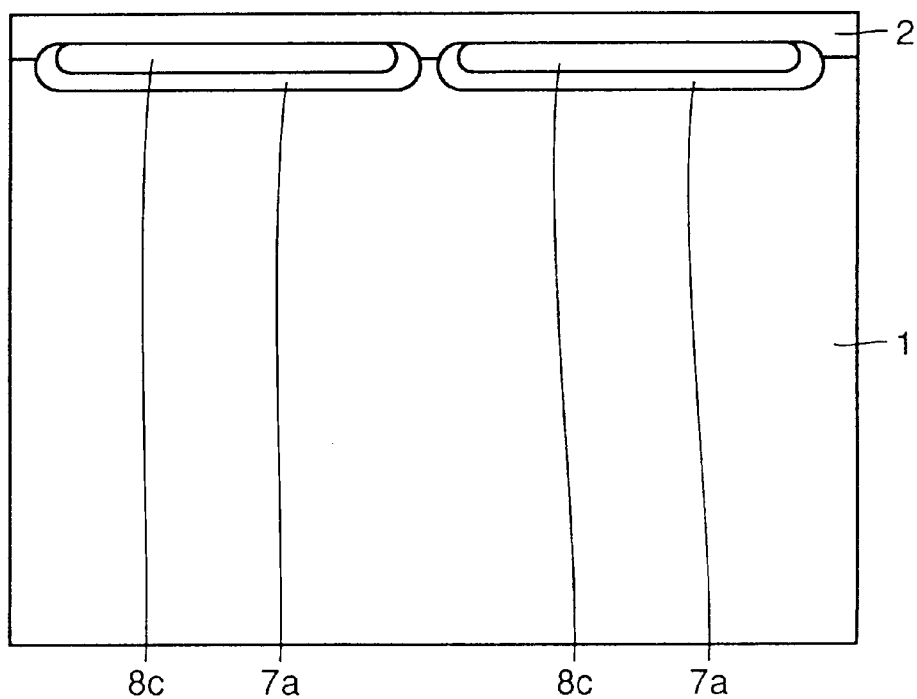

Referring now to FIG. 10, epitaxial layer 2 is formed on the main surface of high specific resistance silicon substrate 1 shown in FIG. 9. This allows buffer silicon layer 7a and buried collector region 8c to be formed in a self-aligned manner.

As buffer silicon layer 7a has been treated to expand in the direction parallel to the main surface of high specific resistance silicon substrate 1, as shown in FIG. 7, it is ensured that buried collector region 8c is formed within buffer silicon layer 7a. This almost ensures that degradation in withstand voltage between adjacent buried collector regions 8c can be prevented.

Furthermore, by using the approach described above, not only buffer silicon layer 7a can be formed precisely, but also only one epitaxial layer is required when compared with the case where buffer silicon layer 7a is formed by epitaxial growth method. This can reduce the manufacturing cost.

In FIG. 10, the reason why buffer silicon layer 7a and buried collector region 8c have moved upward is that the impurity comes to float spontaneously due to the heat treatment at the time of forming epitaxial layer 2.

[Fourth Embodiment]

Figure 11:
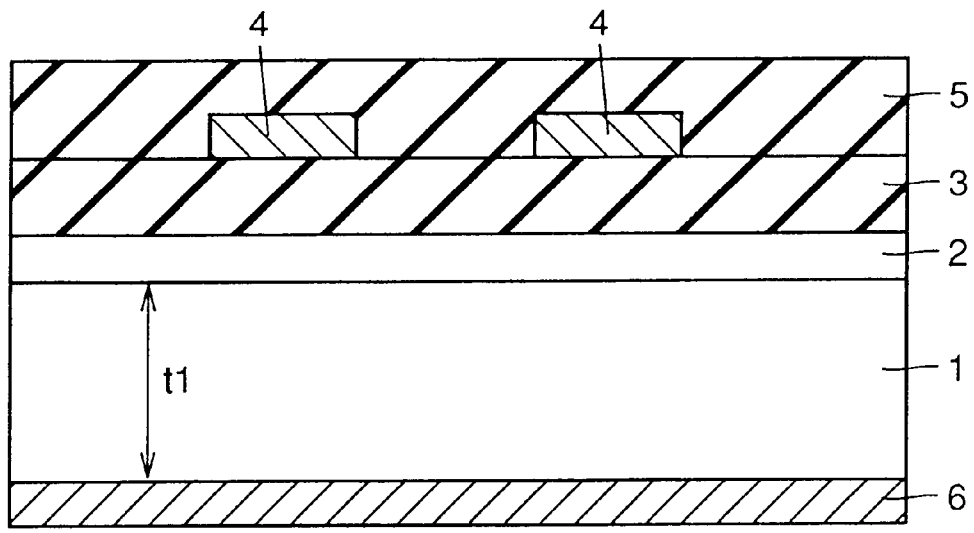
FIG. 11 is a cross sectional view of a fourth embodiment of the HF circuit device according to the present invention.

Referring now to FIG. 11, a fourth embodiment of the present invention will be described. FIG. 11 is a cross sectional view of the fourth embodiment of the HF circuit device of the present invention.

Referring to FIG. 11, in the HF circuit device shown in this figure, the thickness ti of a high specific resistance silicon substrate 1 is reduced to approximately 50–200 $\mu$m. More specifically, the thickness is reduced by polishing a back surface of high specific resistance silicon substrate 1. Other than that structure, the HF circuit device is similar to the HF circuit device shown in FIG. 1.

For a signal of 2 GHz band used for a movable telephone, an electromagnetic wave reaches a depth of approximately 100 $\mu$m from the surface of substrate 1 due to skin effect.

Therefore, it is preferred that the thickness of high specific resistance silicon substrate 1 be at most approximately 100 μm. By decreasing the thickness of high specific resistance silicon substrate 1 as described above, transmission loss of HF signals can effectively be reduced.

It is considered that in principle the thinner the thickness of high specific resistance silicon substrate 1 is, the smaller the transmission loss. However, when considering the working process for incorporating into a package, it is considered that the thickness of high specific resistance silicon substrate 1 requires approximately 100 μm at present in order to maintain mechanical strength against the processing. As the improvement in polishing process is underway, it is considered that a thickness of approximately 50 μm can be implemented in the future.

[Fifth Embodiment]

Figure 12:
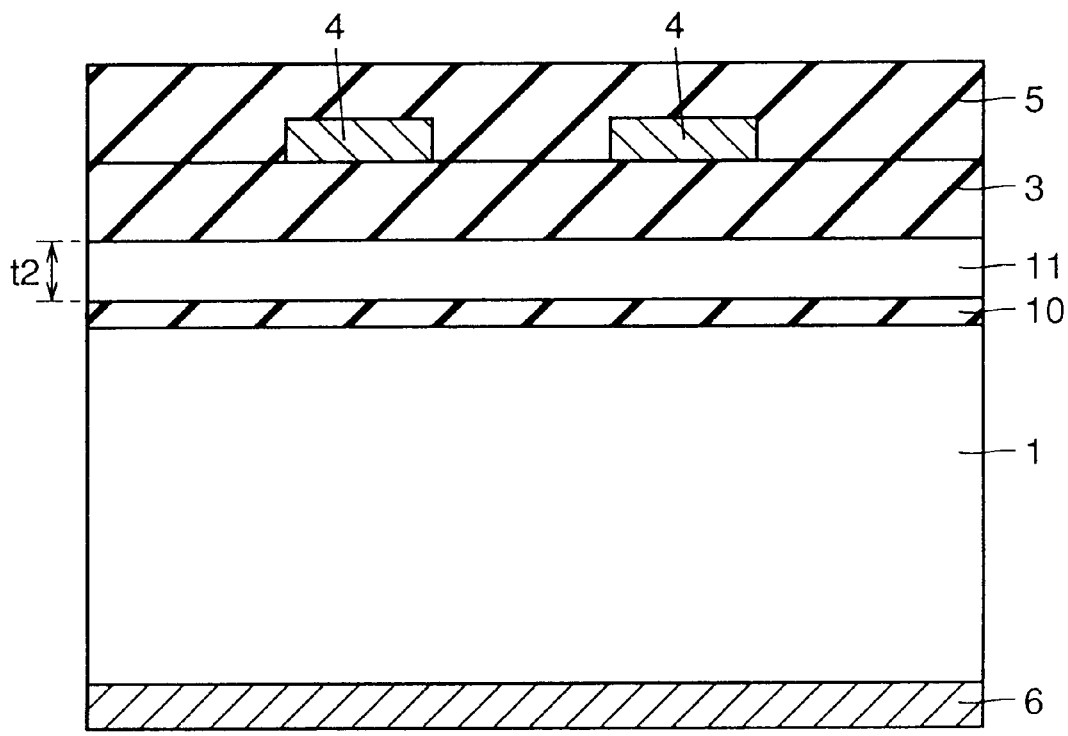
FIG. 12 is a cross sectional view of a fifth embodiment of the HF circuit device according to the present invention.

Referring now to FIG. 12, a fifth embodiment of the present invention will be described. FIG. 12 is a cross sectional view of the fifth embodiment of the HF circuit device of the present invention.

In the fourth embodiment, a technique has been described which reduces the thickness of high specific resistance silicon substrate 1 by polishing the back surface of high specific resistance silicon substrate 1. However, referring to FIG. 12, a thin silicon layer can be formed more easily by using SOI (Semiconductor On Insulator) substrate technique which is practically used at present.

Referring to FIG. 12, a silicon layer 11 is formed on a main surface of a high specific resistance silicon substrate 1 with an oxide film 10 interposed. The thickness t2 of silicon layer 11 is approximately 2–10 μm. A circuit element will be formed in silicon layer 11. An oxide film 3 is formed such that it covers silicon layer 11 and a metal interconnection layer 4 is formed on oxide film 3. An oxide film 5 is formed such that it covers metal interconnection layer 4.

In the arrangement described above, since the thickness of silicon layer 11 can be reduced, transmission loss of HF signals in silicon layer 11 can be reduced.

Referring now to FIGS. 13–17, a method for manufacturing the HF circuit device shown in FIG. 12 will be described. FIGS. 13–17 are cross sectional views illustrating the first to fifth steps of the method for manufacturing the HF circuit device shown in FIG. 12.

Figure 13:
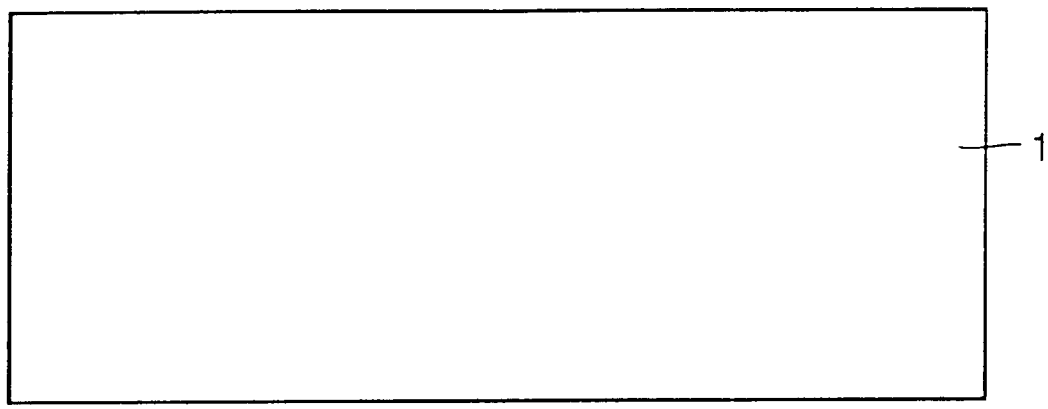
FIGS. 13–17 are cross sectional views illustrating the first to fifth steps of a process for manufacturing the fifth embodiment of the HF circuit device of the present invention.
Figure 14:
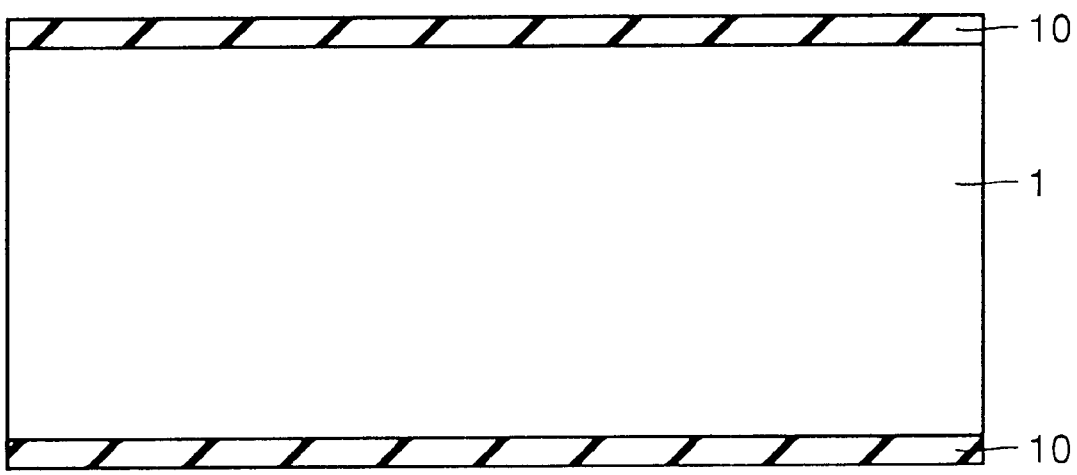

Referring firstly to FIG. 13, a high specific resistance silicon substrate 1 is formed using, for example, the MCZ method. Then, high specific resistance silicon substrate 1 is inserted into a furnace for oxidation and an oxide film 10 is formed on both its main surface and its back surface, as shown in FIG. 14. Preferably, the thickness of oxide film 10 is approximately 2–3 μm.

Figure 15:
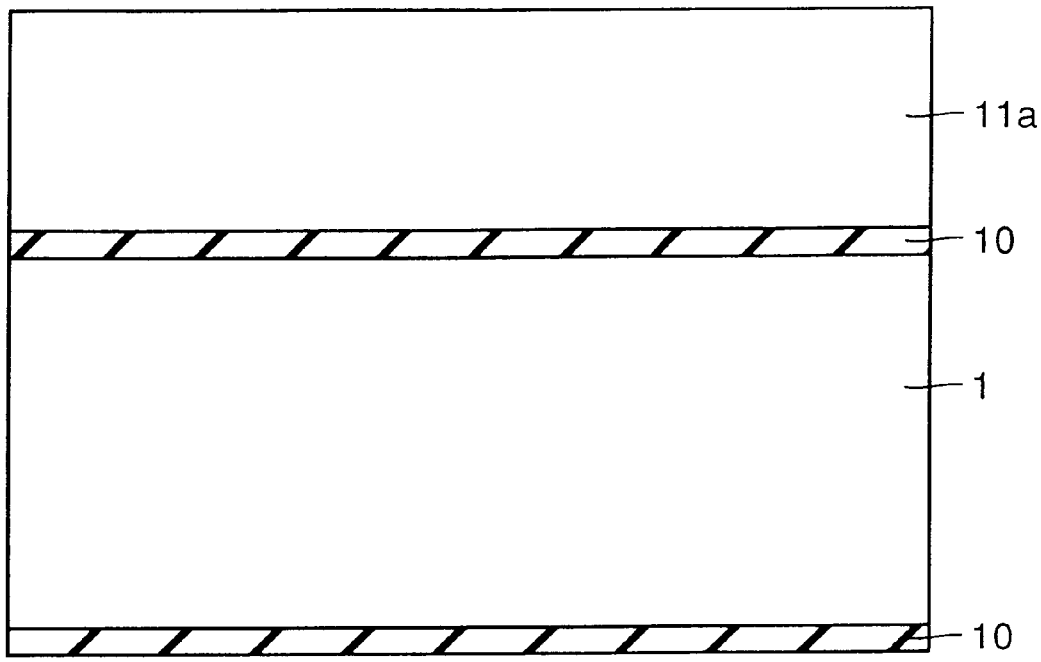

Then, as shown in FIG. 15, a silicon substrate 11a at which a circuit element such as an active element is formed is joined onto a surface of oxide film 10 formed on the main surface of high specific resistance silicon substrate 1. The joining can be performed by superposing one surface of silicon substrate 11a which is polished to have a mirror finished surface onto the surface of oxide film 10 and performing heat treatment at approximately 1100° C. to them.

Figure 16:
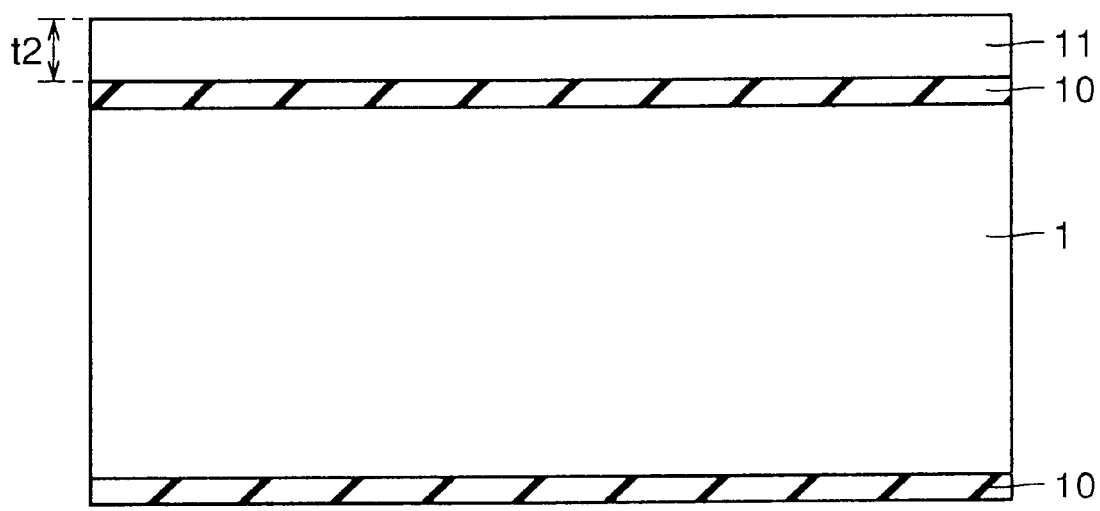

Then, the thickness of silicon substrate 11a is reduced by polishing the other surface of silicon substrate 11a. This forms a silicon layer 11. In FIG. 16, silicon layer 11 is shown which is formed by reducing the thickness of silicon substrate 11a, and it is preferred that the thickness t2 of silicon layer 11 be approximately 2–10 μm.

Figure 17:
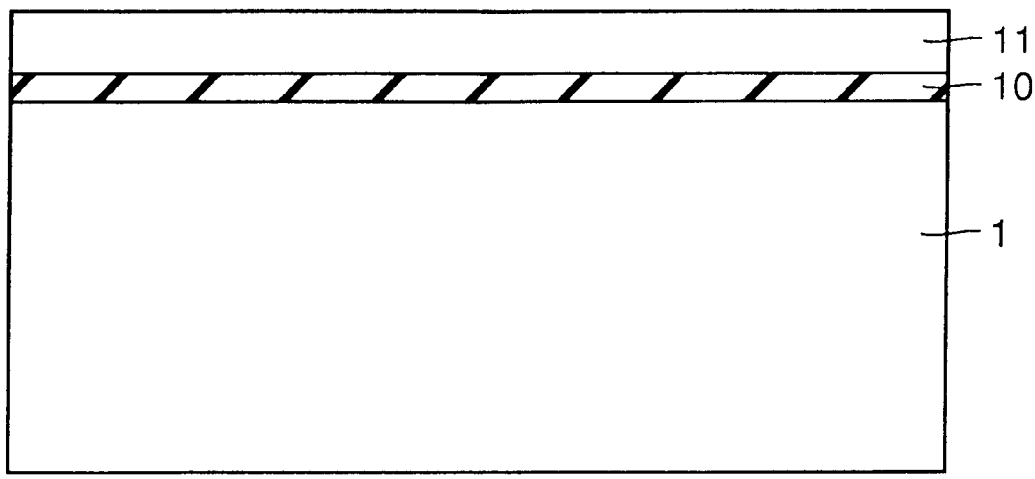

Then, as shown in FIG. 17, oxide film 10 formed on the back surface of high specific resistance silicon substrate 1 is removed by etching. Then, a circuit element such as an active element is formed in silicon layer 11 through a typical wafer process. Then, an oxide film 3 is formed such that it covers silicon layer 11, and a metal interconnection layer 4 is formed on oxide film 3. An oxide film 5 is formed such that it covers metal interconnection layer 4. After going through the steps described above, the HF circuit device shown in FIG. 12 will be completed.

[Sixth Embodiment]

Figure 18:
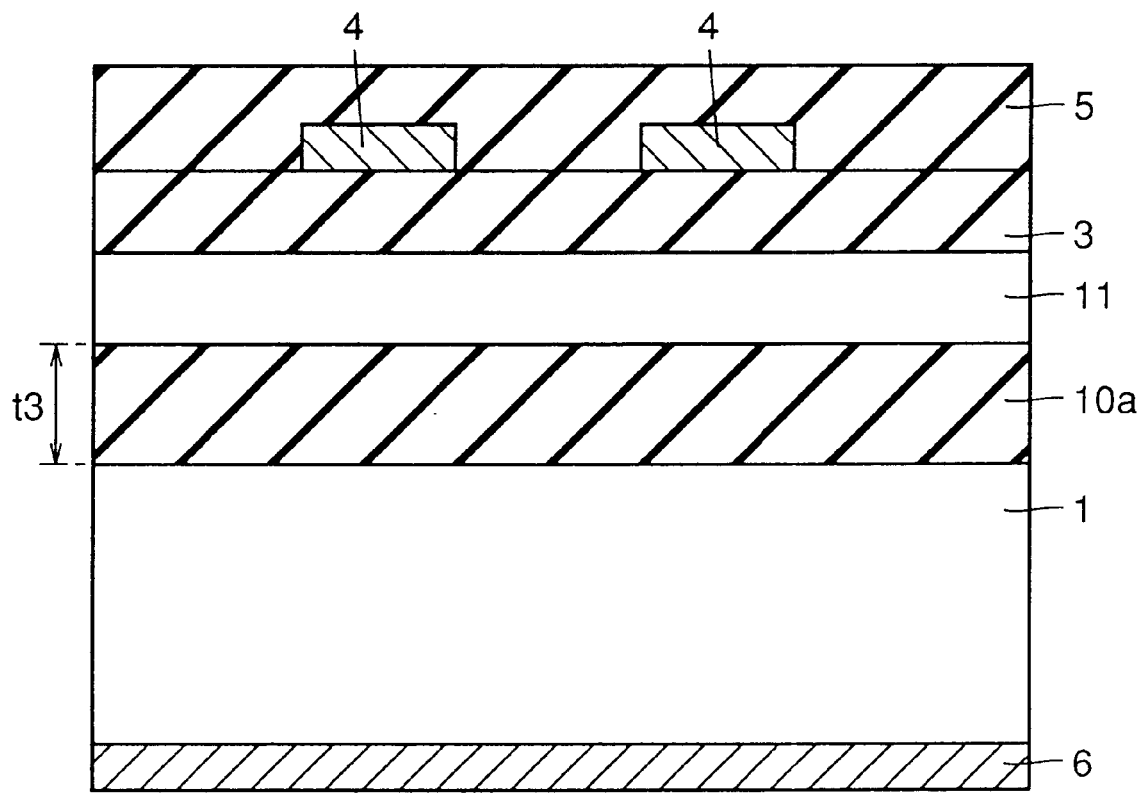
FIG. 18 is a cross sectional view of a sixth embodiment of the HF circuit device according to the present invention.

Referring now to FIG. 18, a sixth embodiment of the present invention will be described. FIG. 18 is a cross sectional view of the sixth embodiment of the HF circuit device of the present invention.

Referring to FIG. 18, in the present embodiment of the HF circuit device, the thickness t3 of an oxide film 10a is relatively thick, being approximately 10–30 μm. This can reduce transmission loss of HF signals. Other than that structure, the present embodiment is similar to the HF circuit device shown in FIG. 12. As shown in FIG. 18, the thickness t3 of oxide film 10a may be the same as or more than that of a silicon layer 11 (approximately 5 μm).

A technique forming the relatively thick oxide film 10a described above includes a method in which oxidation is performed for hours with a high pressure or at a high temperature and a method in which BSG (Boron Silicate Glass) film is made thick.

[Seventh Embodiment]

Figure 19:
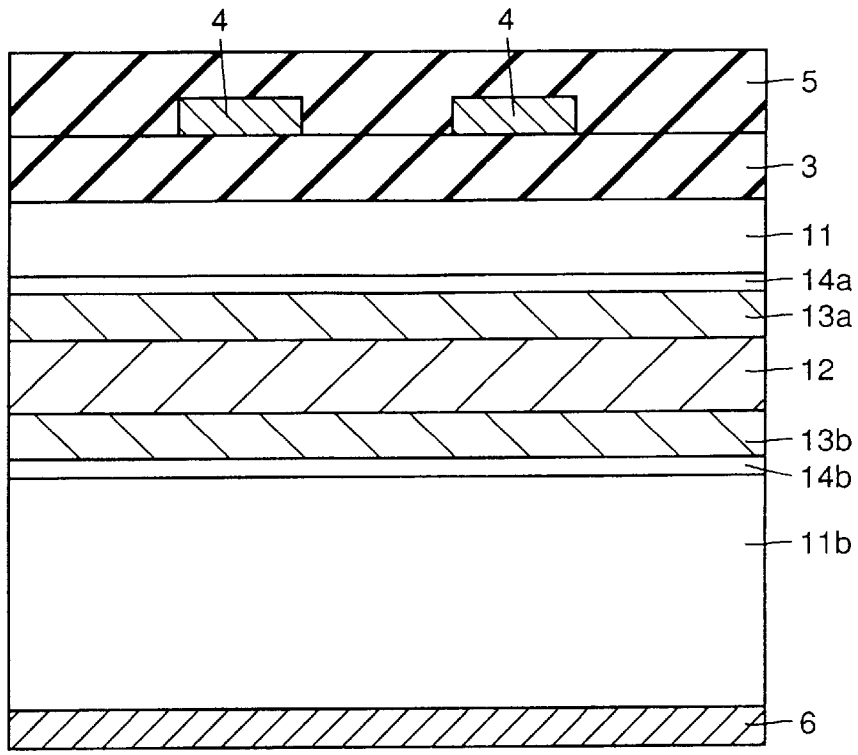
FIG. 19 is a cross sectional view of a seventh embodiment of the HF circuit device according to the present invention.

Referring now to FIG. 19, a seventh embodiment of the present invention will be described. FIG. 19 is a cross sectional view of the seventh embodiment of the HF circuit device of the present invention.

In each of the embodiments described above of the HF circuit device, arrangements have been described in which the transmission loss is reduced by using high specific resistance silicon substrate 1. However, a substrate structure in which impedance matching is taken into account will be required in order to design an HF circuit. An interconnection structure referred to as strip line is generally used as a line of high frequency. In this interconnection structure, the thickness of a dielectric is appropriately determined considering an impedance of the dielectric positioned under a metal interconnection layer, and a metal layer is formed at a lower surface of the dielectric film. By optimizing the material and thickness of the dielectric film, an impedance of 50Ω used in the HF circuit will be realized.

Referring to FIG. 19, a buffer metal layer 13b is formed on a main surface of a silicon substrate 11b with an oxide film 14b interposed. A shield metal layer 12 is formed on buffer metal layer 13b. A buffer metal layer 13a is further formed on shield metal layer 12, and a silicon layer 11 is formed on buffer metal layer 13a with oxide film 14a interposed. An oxide film 3 is formed on silicon layer 11 and a metal interconnection layer 4 is formed on oxide film 3. An oxide film 5 is formed such that it covers metal interconnection layer 4.

A circuit element such as an active element is formed in silicon layer 11. Shield metal layer 12 has a function to shield a line of electric force from the active element formed in silicon layer 11. Buffer metal layer 13a, 13b is provided for joining shield metal layer 12 and oxide film 14a, 14b. Since the line of electric force from the active element can be shielded by the shield metal layer 12 described above, a typical silicon substrate other than a high specific resistance silicon substrate can be used as silicon substrate 11b.

Now, shield metal layer 12 will be described in detail. Shield metal layer 12 is required to have a low resistance and to have heat-resisting property. As shield metal layer 12 has a low resistance, a line of electric force can be terminated while hardly causing the transmission loss. Furthermore, as shield metal layer 12 has a superior heat-resisting property, it can endure the heat treatment of the wafer process. Considering the above, it is preferred that a metal generally referred to as refractory metal be used for shield metal layer 12. More specifically, the example includes nickel (volume resistivity=6.9Ω), tungsten (5.48Ω), molybdenum (4.77Ω).

Figure 20:
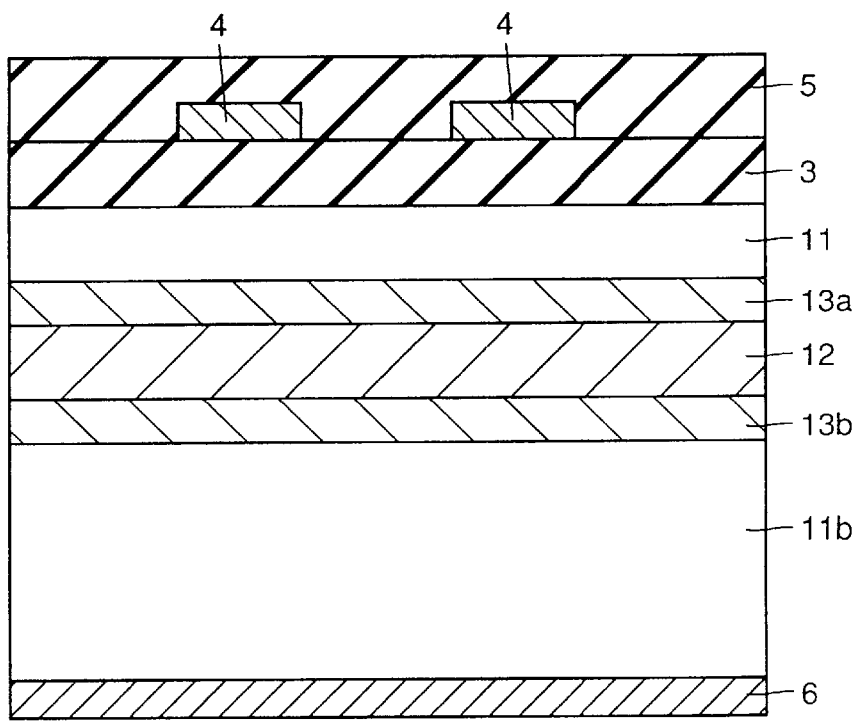
FIG. 20 is a cross sectional view of a modification of the seventh embodiment of the HF circuit device according to the present invention.

Referring now to FIG. 20, a modification of the seventh embodiment shown in FIG. 19 will be described. FIG. 20 is a cross sectional view of the modification of the seventh embodiment described above of the HF circuit device.

Referring to FIG. 20, oxide film 14a, 14b is not formed in the present modification. Other than that structure, the HF circuit device of the present modification is similar to the HF circuit device shown in FIG. 19. Buffer metal layer 13a, 13b has been provided for joining oxide film 14a, 14b and shield metal layer 12. However, silicon substrate 11b or silicon layer 11 and shield metal layer 12 may be directly joined without oxide film 14a, 14b interposed. This can simplify the manufacturing process.

Referring now to FIGS. 21–25, an example of a method for manufacturing the HF circuit device shown in FIG. 20 will be described. FIGS. 21–25 are cross sectional views illustrating the first to fifth steps of a example of a method for manufacturing the HF circuit device shown in FIG. 20.

Figure 21A:
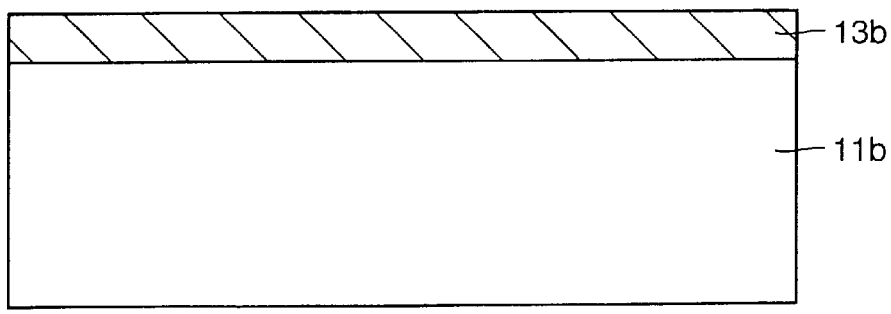
FIGS. 21A and 21B are cross sectional views illustrating the first step of an example of a method for manufacturing the HF circuit device showing in FIG. 20.
Figure 21B:
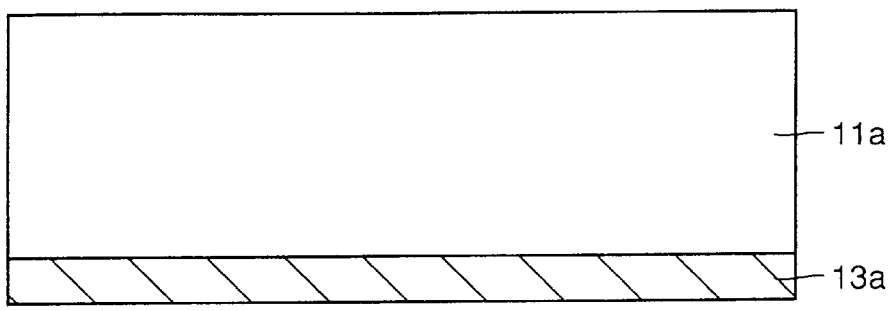

Referring firstly to FIG. 21A, a buffer metal layer 13b of chrome, e.g., is formed on a main surface of a silicon substrate 11b by using, for example, vacuum evaporation. On the other hand, as shown in FIG. 21B, a buffer silicon layer 13a is similarly formed on a back surface of a silicon substrate 11a for forming a silicon layer 11.

Figure 22A:
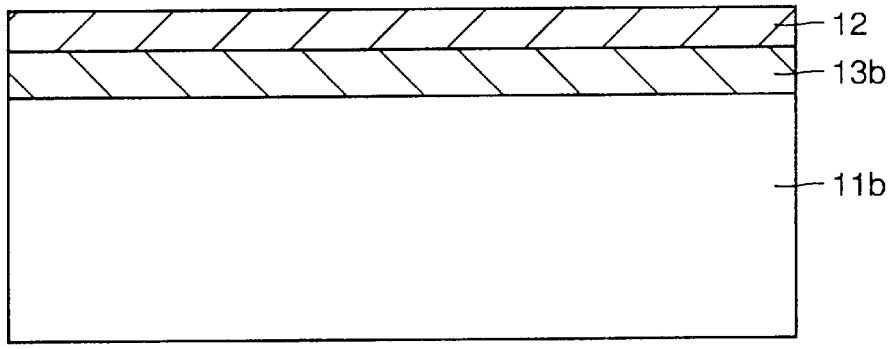
FIGS. 22A and 22B are cross sectional views illustrating the second step of the example of the method for manufacturing the HF circuit device showing in FIG. 20.
Figure 22B:
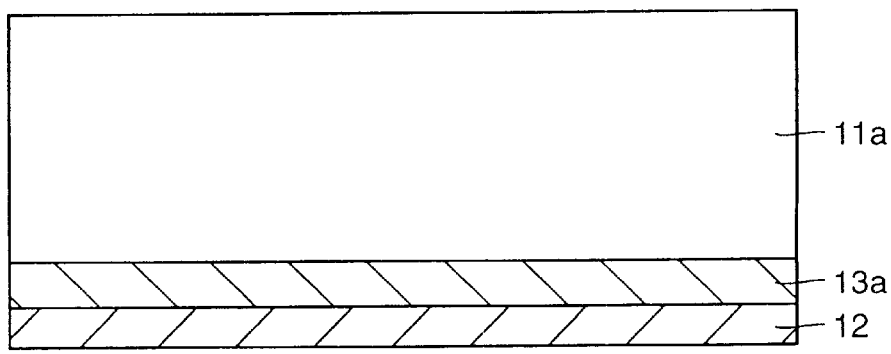

Referring now to FIG. 22A, a shield metal layer 12 is formed on a surface of buffer metal layer 13b. As shown in FIG. 22B, a shield metal layer 12 is also formed on a surface of buffer metal layer 13a.

Figure 23:
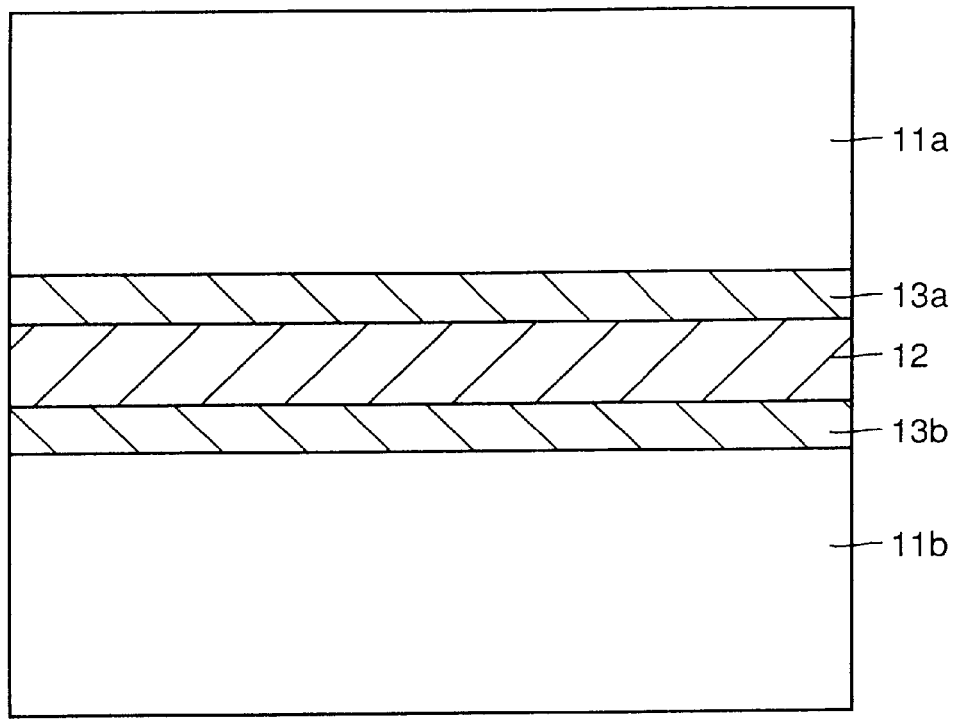
FIGS. 23–25 are cross sectional views illustrating the third to fifth steps of the example of the method for manufacturing the HF circuit device shown in FIG. 20.

Then, as shown in FIG. 23, shield metal layer 12 formed on silicon substrate 11b and shield metal layer 12 formed on the back surface of silicon substrate 11a are superposed to each other. Then, the shield metal layers 12 are joined by heat treatment. Thus, a pair of shield metal layers 12 shown in FIG. 22 is integrated.

In this case, if tungsten or molybdenum is used as a material of shield metal layer 12, a metal layer consisting, for example, of nickel or platinum (not shown) is preferably formed at the top of at least one of the shield metal layers 12 shown in FIGS. 22A and 22B. The metal layer consisting of nickel or platinum reacts at the temperature or higher of heat treatment of the wafer process and is of a material of face centered cubic structure. Furthermore, it is preferred that the metal layer consisting of nickel or platinum be formed to a thickness within approximately 1 μm.

Figure 24:
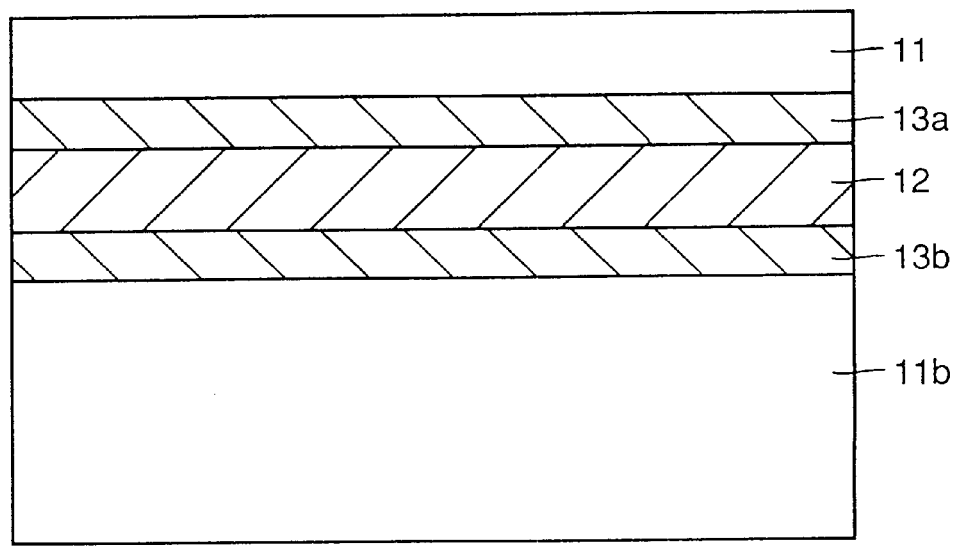
Figure 25:
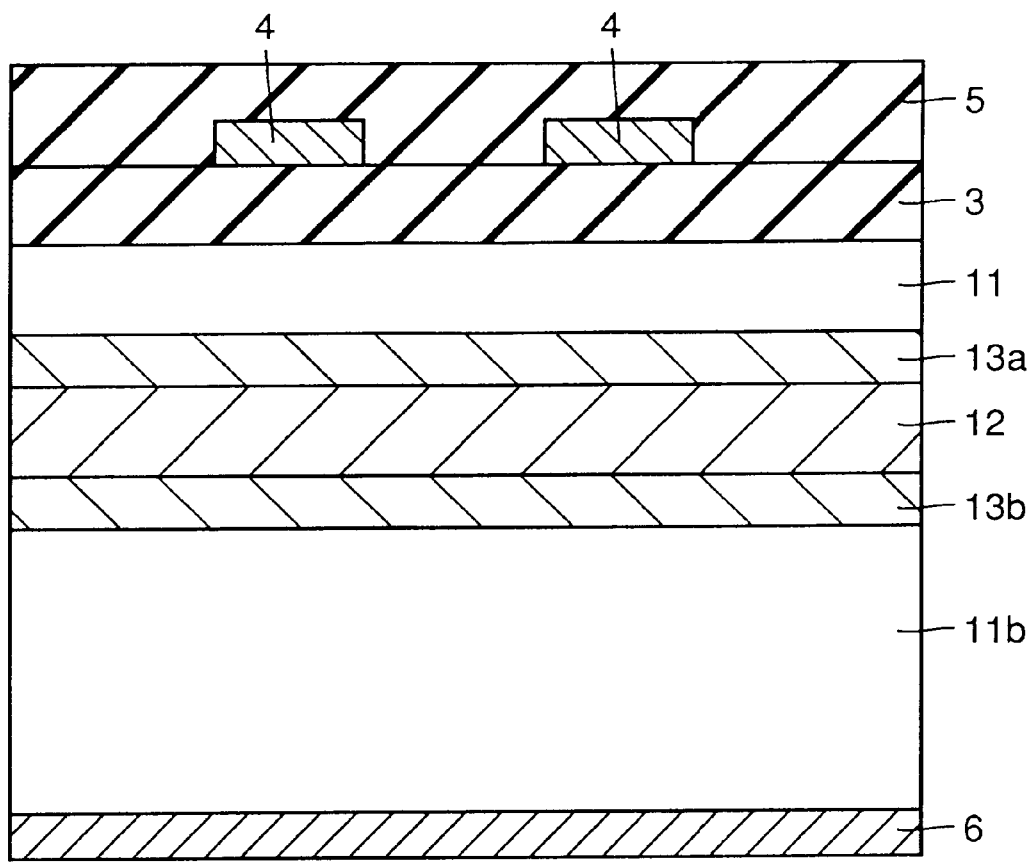

After shield metal layer 12 is formed as described above, preferably the thickness of silicon substrate 11a is reduced. This forms a silicon layer 11 as shown in FIG. 24. Then, a circuit element such as an active element is formed in silicon layer 11 and an oxide film 3 is formed such that it covers silicon layer 11. Then, a metal interconnection layer 4 is formed on oxide film 3, and an oxide film 5 is formed such that it covers metal interconnection layer 4. After going through the foregoing process, the HF circuit device shown in FIG. 20 will be completed.

In manufacturing the HF circuit device shown in FIG. 19, oxide film 14a, 14b is only required to be formed prior to forming buffer metal layer 13a, 13b in the manufacturing method described above. Furthermore, in the HF circuit device shown in FIG. 19, a value of impedance of 50Ω can be obtained by thinning the thickness of silicon layer 11 to approximately several μm and thickening the thickness of oxide film 14a to approximately 10–30 μm. As a result, the thickness of silicon layer 11 becomes considerably thinner than that of silicon substrate 11b, and the thickness of oxide film 14a is the same as or greater than that of silicon layer 11. For a technique to increase the thickness of oxide film 14a, the similar technique to the one described in the sixth embodiment can be used.

Referring now to FIGS. 26–29, another example of the method for manufacturing the HF circuit device shown in FIG. 20 will be described. FIGS. 26–29 are cross sectional views illustrating the first to fourth steps of said another example of the method of manufacturing the HF circuit device shown in FIG. 20.

Figure 26:
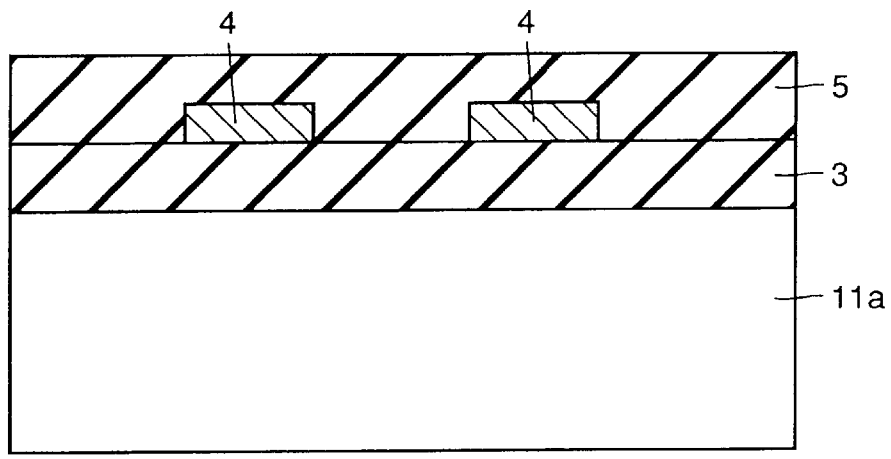
FIG. 26 is a cross sectional view illustrating the first step of another example of the method for manufacturing the HF circuit device shown in FIG. 20.

Referring firstly to FIG. 26, a circuit element such as an active element is formed on a main surface of a silicon substrate 11a through wafer process. Furthermore, an oxide film 3 is formed such that it covers the main surface of silicon substrate 11a, and a metal interconnection layer 4 is formed on oxide film 3. Then, an oxide film 5 is formed such that it covers metal interconnection layer 4.

Figure 27A:
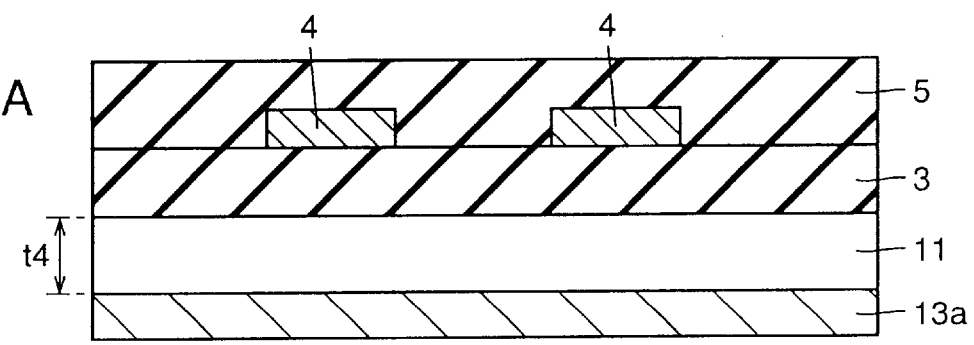
FIGS. 27A and 27B are cross sectional views illustrating the second step of the aforementioned another example of the method for manufacturing the HF circuit device shown in FIG. 20.
Figure 27B:
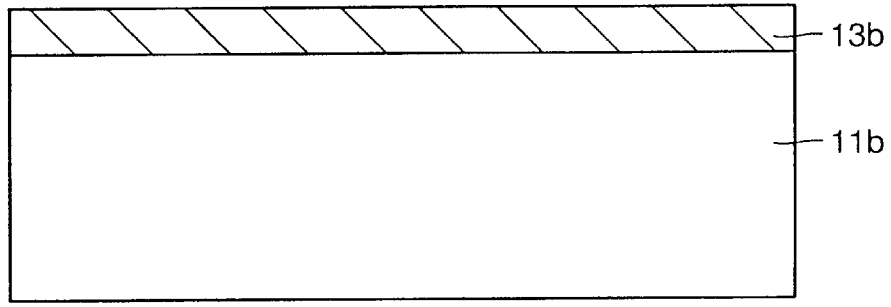

Then, referring to FIG. 27A, a back surface of silicon substrate 11a is polished. This forms a silicon layer 11. Preferably, the thickness t4 of silicon layer 11 is approximately several ten μm. However, since an HF circuit is to be formed between silicon layer 11 and a metal layer formed thereunder, the thickness t4 of silicon layer 11 is selected so that total dielectric constant is taken into account. Then, a buffer metal layer 13a is formed on a back surface of silicon layer 11. Furthermore, as shown in FIG. 27B, a buffer metal layer 13b is formed on a main surface of a silicon substrate 11b.

Figure 28A:
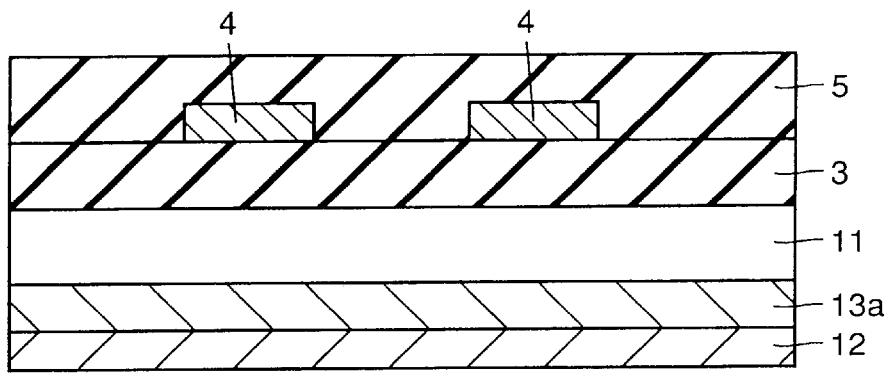
FIGS. 28A and 28B are cross sectional views illustrating the third step of the aforementioned another example of the method for manufacturing the HF circuit device shown in FIG. 20.
Figure 28B:
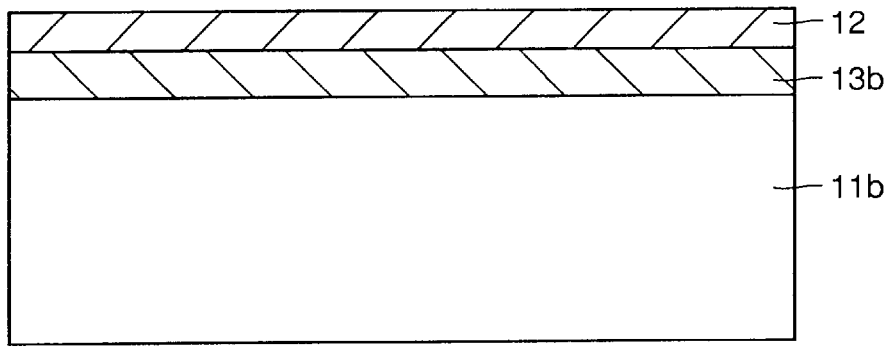
Figure 29:
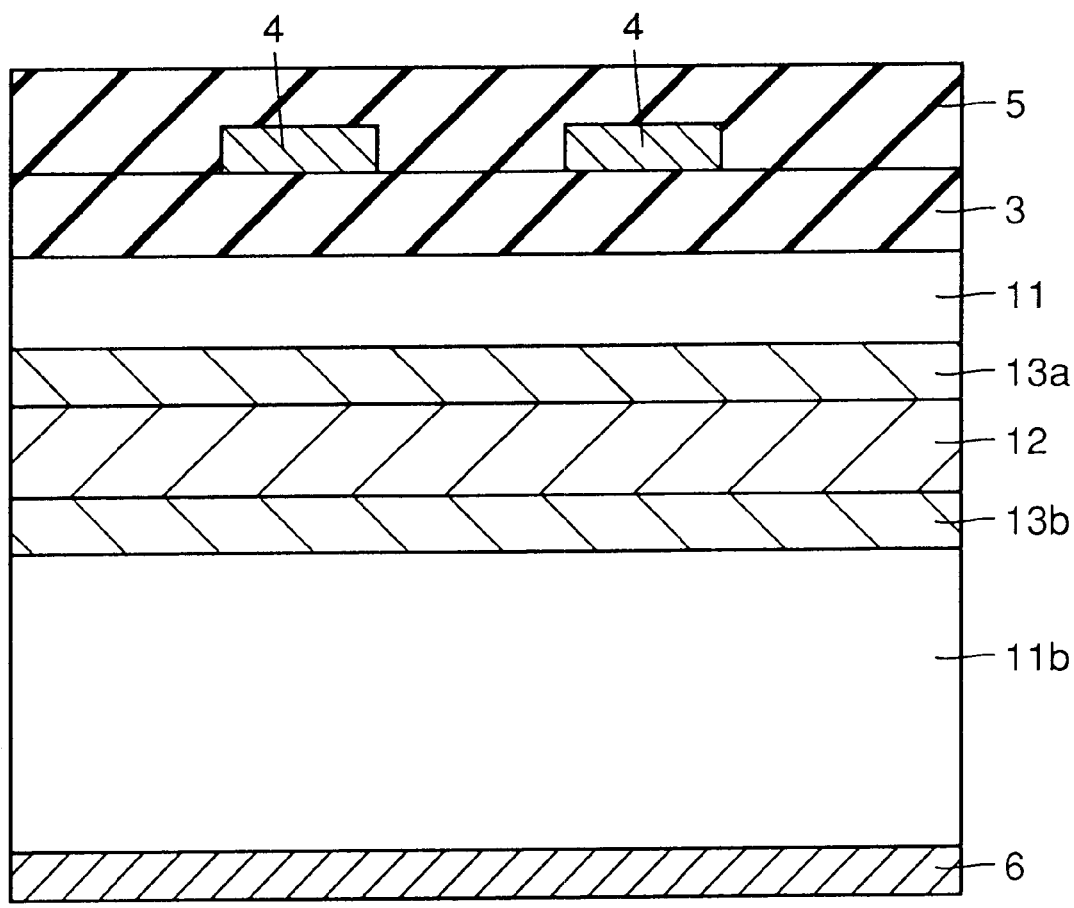
FIG. 29 is a cross sectional view illustrating the fourth step of the aforementioned another example of the method for manufacturing the HF circuit device shown in FIG. 20.

Referring now to FIG. 28A, a shield metal layer 12 is formed on a surface of buffer metal layer 13a. Also, as shown in FIG. 28B, a shield metal layer 12 is formed on a surface of buffer metal layer 13b. Then, silicon substrate 11b and silicon layer 11 are superposed to each other. Then, an HF circuit device shown in FIG. 29 is formed by joining the shield metal layers 12.

In the manufacturing method described above, since a wafer is used on which a circuit element such as an active element has already been formed, an aluminum interconnection layer has already been formed on silicon layer 11. Accordingly, shield metal layers 12 need to be joined at a low temperature which will not affect the aluminum interconnection layer described above. More specifically, the joining should be performed at a temperature of or below approximately 400–500° C. For shield metal layer 12 in this case, a metal with a low melting point such as gold and silver is required to be used.

An eutectic metal with a low melting point can be formed at the time of joining by using gold for shield metal layer 12 in FIG. 28A and using gold and tin for the uppermost and underlying layers of shield metal layer 12 in FIG. 28B, respectively (not shown). This enables a joining almost free of defects. At that time, by making tin thinner than gold, the melting point of shield metal layer 12 after the reaction can be made higher than eutectic temperature. This enables the production of an HF circuit device which will not separate due to heating in the following assembling process (such as die-bonding).

Furthermore, in FIG. 28B, the formation of buffer metal layer 13b can be omitted. In this case, a metal layer, for example, of aluminum or gold is formed directly on silicon substrate 11b. This causes aluminum or gold to react with silicon and alloy layer with a low melting point is formed.

On the other hand, aluminum or gold is used for shield metal layer 12 of FIG. 28A and it is formed on buffer metal layer 13a. Thus, an HF circuit device, which does not involve the performance degradation of the active element and does not have defects such as separation, can be manufactured by a simple process.

[Eighth Embodiment]

Figure 30:
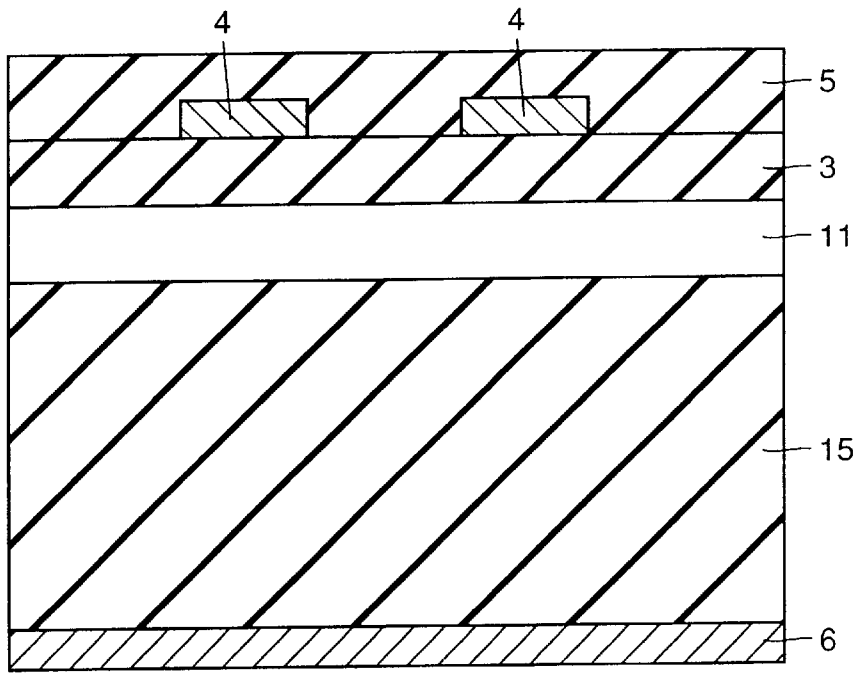
FIG. 30 is a cross sectional view of an eighth embodiment of the HF circuit device of the present invention.

Referring now to FIG. 30, an eighth embodiment of the present invention will be described. FIG. 30 is a cross sectional view of the eighth embodiment of the HF circuit device of the present invention.

Referring to FIG. 30, a silicon layer 11 is formed directly on a main surface of a supporting substrate 15 consisting of an insulator such as quartz. Furthermore, an oxide film 3 is formed such that it covers silicon layer 11, and a metal interconnection layer 4 is formed on oxide film 3. Furthermore, an oxide film 5 is formed such that it covers metal interconnection layer 4. On the other hand, a back-surface metal layer 6 is formed on a back surface of supporting substrate 15.

In the structure described above, as supporting substrate 15 is an insulator such as quartz, transmission loss of HF signals is almost avoided. Furthermore, approximately 2–10 μm suffice as the thickness of silicon layer 11. Furthermore, as supporting substrate 15 is of an insulator, silicon layer 11 can be formed directly on the main surface of the supporting substrate 15.

For a method for manufacturing the eighth embodiment of the HF circuit device, a similar method to the method for manufacturing the fifth embodiment of the HF circuit device can used. More specifically, the HF circuit device shown in FIG. 30 can be formed without forming oxide film 10 and by replacing high specific resistance silicon substrate 1 with supporting substrate 15 in the method for manufacturing the fifth embodiment shown in FIGS. 13–17.

[Ninth Embodiment]

Figure 31:
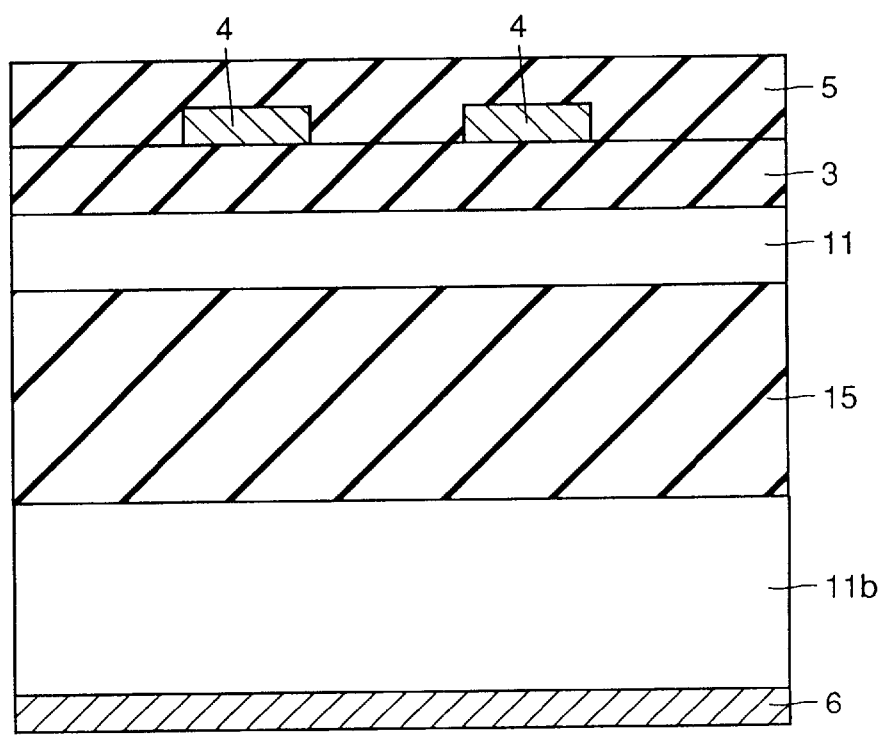
FIG. 31 is a cross sectional view of a ninth embodiment of the HF circuit device of the present invention.
Figure 32:
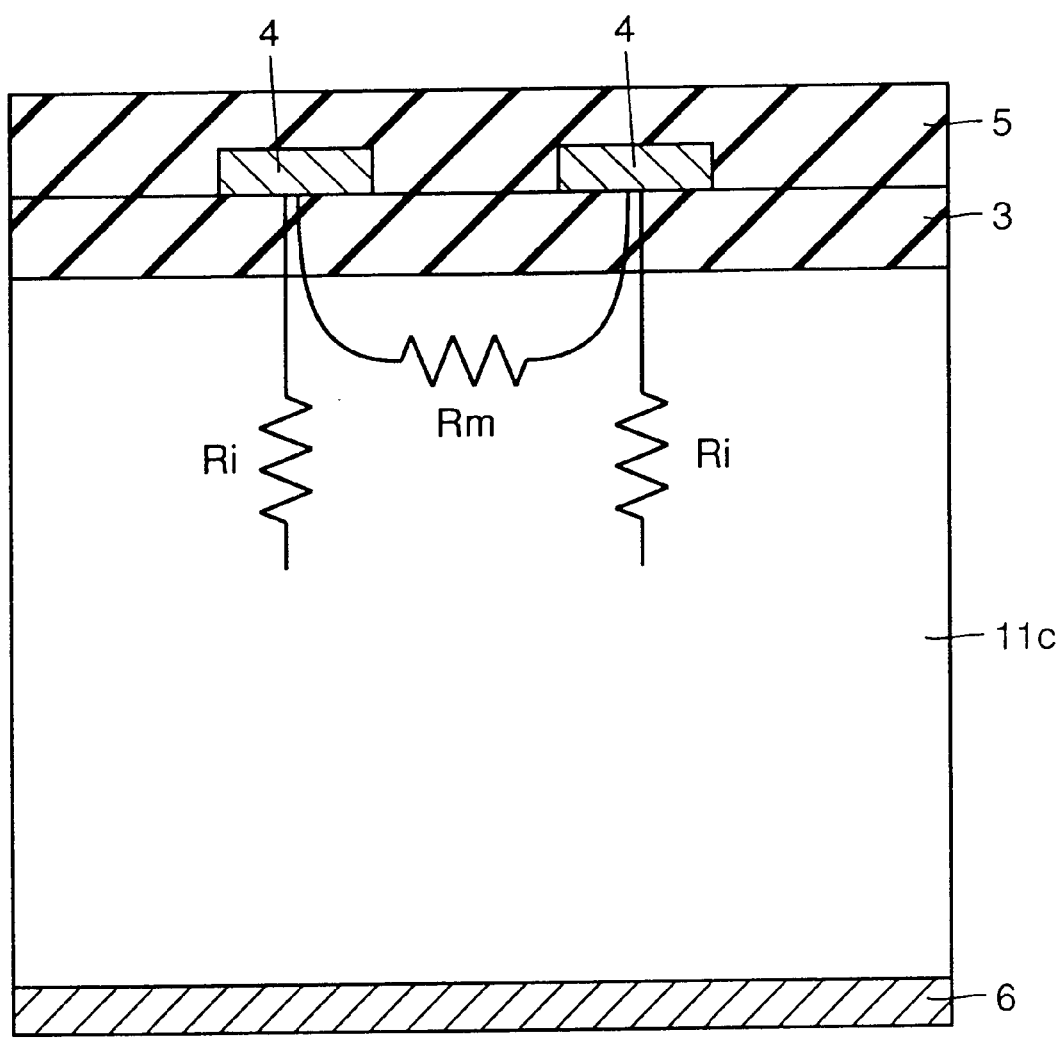
FIG. 32 is a cross sectional view of an example of a conventional HF circuit device.

Referring now to FIG. 31, a ninth embodiment of the present invention will be described. FIG. 31 is a cross sectional view of the ninth embodiment of the HF circuit device of the present invention.

Referring to FIG. 31, in the present embodiment of the HF circuit device, a silicon layer 11 is formed on a main surface of a quartz wafer 15a and a silicon substrate 11b is formed at a back surface of quartz wafer 15a. Other than that structure, the present embodiment is similar to the HF circuit device shown in FIG. 30.

In most wafer process devices, alignment is performed by irradiating a back surface of a substrate with light. Therefore, it is considered that if a quartz wafer is used, it could be difficult to detect a position for alignment within a wafer process devices. In that case, by providing the back surface of quartz wafer 15a with silicon substrate 11b, the position can be detected more accurately.

Furthermore, the difference of coefficient of thermal expansion between quartz and silicon can cause warp of quartz wafer 15a. In order to prevent that, silicon layer 11 and silicon substrate 11b are formed on the main and back surfaces of quartz wafer 15a, respectively, thereby avoiding the warp of quartz wafer 15a. Preferably, the thickness of silicon substrate 11b is at least the thickness of silicon layer 11.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high-frequency (HF) circuit device comprising:

a silicon substrate having a main surface and having a specific resistance of at least 100 Ωcm;

an epitaxial layer formed on said main surface of said silicon substrate;

buffer silicon layers, separated from each other, formed between said epitaxial layer and said silicon substrate;

transistors formed in said epitaxial layer and said separated buffer silicon layers;

an insulating layer formed such that it covers a main surface of said silicon substrate;

a metal interconnection layer formed on said insulating layer; and each of said transistors being individually surrounded by one of said separated individual buffer silicon layers, wherein only one transistor is surrounded by one separated buffer silicon layer, wherein the width of the buffer silicon layer is substantially equal to that of each transistor.

2. The HF circuit device according to claim 1, wherein the specific resistance of said silicon substrate is at least 500 Ωcm.

3. A high-frequency (HF) circuit device comprising:

a silicon substrate having a main surface and having a specific resistance of at least 100 Ωcm;

an epitaxial layer formed on said main surface of said silicon substrate;

buffer silicon layers, separated from each other, formed between said epitaxial layer and said silicon substrate;

transistors formed in said epitaxial layer and said separated buffer silicon layers;

an insulating layer formed such that it covers a main surface of said silicon substrate;

a metal interconnection layer formed on said insulating layer; and each of said transistors being individually surrounded by one of said separated individual buffer silicon layers, wherein a buffer silicon layer is formed in a self-aligned manner with respect to a buried layer, and only one transistor is surrounded by one separated buffer silicon layer, wherein the width of the buffer silicon layer is substantially equal to that of each transistor.

* * * * *